United States Patent
Yoshida et al.

(10) Patent No.: US 10,276,502 B2
(45) Date of Patent: Apr. 30, 2019

(54) SEMICONDUCTOR DEVICE AND METHOD FOR MANUFACTURING SAME

(71) Applicant: Mitsubishi Electric Corporation, Chiyoda-ku (JP)

(72) Inventors: Motoru Yoshida, Tokyo (JP); Hiroaki Okabe, Tokyo (JP); Kazuyuki Sugahara, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/555,381

(22) PCT Filed: Nov. 27, 2015

(86) PCT No.: PCT/JP2015/083340
§ 371 (c)(1),
(2) Date: Sep. 1, 2017

(87) PCT Pub. No.: WO2016/157616
PCT Pub. Date: Oct. 6, 2016

(65) Prior Publication Data
US 2018/0040563 A1 Feb. 8, 2018

(30) Foreign Application Priority Data
Mar. 27, 2015 (JP) .................. 2015-066341

(51) Int. Cl.
*H01L 23/532* (2006.01)
*H01L 21/3213* (2006.01)
(Continued)

(52) U.S. Cl.
CPC .... *H01L 23/53238* (2013.01); *H01L 21/0495* (2013.01); *H01L 21/28* (2013.01);
(Continued)

(58) Field of Classification Search
CPC .......... H01L 23/53238; H01L 21/0495; H01L 21/28
See application file for complete search history.

(56) References Cited

U.S. PATENT DOCUMENTS 5,751,067 A 5/1998 Mikagi
6,090,701 A * 7/2000 Hasunuma ........ H01L 21/76882
257/E21.588
(Continued)

FOREIGN PATENT DOCUMENTS

| JP | 05-315332 A | 11/1993 |
|---|---|---|
| JP | 6-291201 A | 10/1994 |

(Continued)

OTHER PUBLICATIONS

International Search Report dated Feb. 16, 2016 in PCT/JP2015/083340 filed Nov. 27, 2015.
(Continued)

*Primary Examiner* — Su C Kim
*Assistant Examiner* — David S Wilbert
(74) *Attorney, Agent, or Firm* — Oblon, McClelland, Maier & Neustadt, L.L.P.

(57) ABSTRACT

A method for manufacturing a semiconductor device includes: a process of forming a Cu wiring electrode by a plating method above a semiconductor element using a wide bandgap semiconductor as a base material; a reducing process of reducing the Cu wiring electrode under a $NH_3$ atmosphere; a heating process of heating the Cu wiring electrode at the same time as the reducing process; a process of forming a diffusion prevention film covering the Cu wiring electrode after the heating process; and a sealing process of covering the diffusion prevention film with an organic resin film.

23 Claims, 15 Drawing Sheets

(51) Int. Cl.
*H01L 29/47* (2006.01)
*H01L 29/06* (2006.01)
*H01L 29/872* (2006.01)
*H01L 21/28* (2006.01)
*H01L 21/768* (2006.01)
*H01L 21/3205* (2006.01)
*H01L 21/04* (2006.01)
*H01L 29/40* (2006.01)
*H01L 23/36* (2006.01)
*H01L 23/373* (2006.01)
*H01L 23/433* (2006.01)
*H01L 23/31* (2006.01)
*H01L 29/78* (2006.01)
*H01L 29/808* (2006.01)
*H01L 29/861* (2006.01)
*H01L 29/16* (2006.01)
*H01L 29/739* (2006.01)
*H01L 23/495* (2006.01)

(52) U.S. Cl.
CPC .... *H01L 21/3205* (2013.01); *H01L 21/32139* (2013.01); *H01L 21/768* (2013.01); *H01L 21/76865* (2013.01); *H01L 23/3171* (2013.01); *H01L 23/36* (2013.01); *H01L 23/3735* (2013.01); *H01L 23/4334* (2013.01); *H01L 29/0615* (2013.01); *H01L 29/0619* (2013.01); *H01L 29/0657* (2013.01); *H01L 29/401* (2013.01); *H01L 29/47* (2013.01); *H01L 29/7802* (2013.01); *H01L 29/872* (2013.01); *H01L 23/3121* (2013.01); *H01L 23/49562* (2013.01); *H01L 29/1608* (2013.01); *H01L 29/7395* (2013.01); *H01L 29/8083* (2013.01); *H01L 29/8611* (2013.01); *H01L 2224/32225* (2013.01); *H01L 2224/33* (2013.01); *H01L 2924/181* (2013.01)

(56) References Cited

U.S. PATENT DOCUMENTS

| | | | |
|---|---|---|---|
| 2007/0292603 A1* | 12/2007 | Dordi | H01L 21/0206 427/98.1 |
| 2010/0025852 A1 | 2/2010 | Ueki et al. | |
| 2015/0214376 A1* | 7/2015 | Koezuka | G02F 1/1368 257/43 |

FOREIGN PATENT DOCUMENTS

| | | |
|---|---|---|
| JP | 2000-164709 A | 6/2000 |
| JP | 2002-170879 A | 6/2002 |
| JP | 2002-217199 A | 8/2002 |
| JP | 2004-063980 A | 2/2004 |
| JP | 2006-156486 A | 6/2006 |
| JP | 2006-324301 A | 11/2006 |
| JP | 2006-351732 A | 12/2006 |
| JP | 2010-003767 A | 1/2010 |
| JP | 2013-125922 A | 6/2013 |
| JP | 2013-182936 A | 9/2013 |
| JP | 2014-110362 A | 6/2014 |
| WO | 2008/078649 A1 | 7/2008 |

OTHER PUBLICATIONS

International Preliminary Report on Patentability and Written Opinion dated Oct. 12, 2017 in PCT/JP2015/083340 (with English translation).

Japanese Office Action dated Jul. 12, 2016 in Japanese Patent Application No. 2016-522118 (with unedited computer generated English translation).

Japanese Office Action dated Oct. 18, 2016 in Japanese Patent Application No. 2016-522118 (with unedited computer generated English translation).

* cited by examiner

F I G. 1
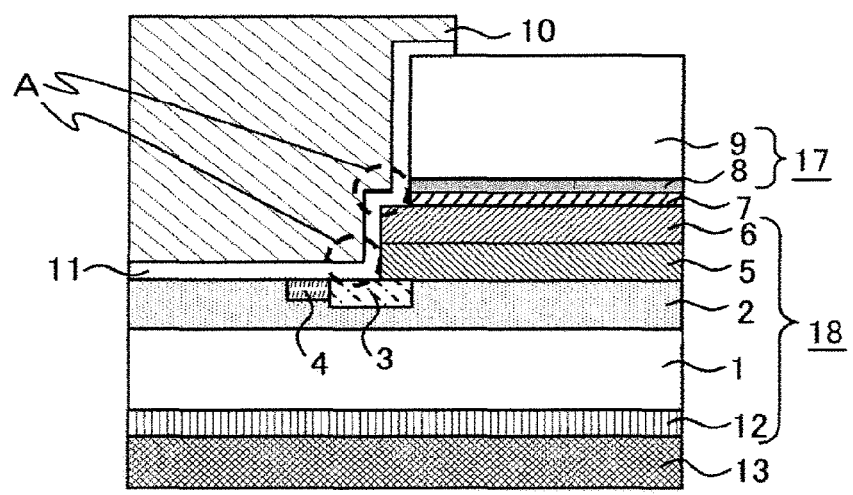

F I G. 1 9
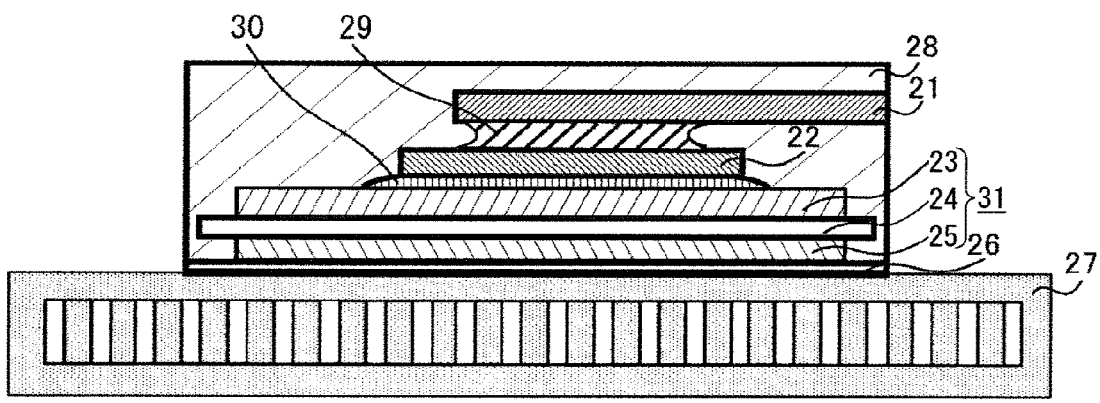

SEMICONDUCTOR DEVICE AND METHOD FOR MANUFACTURING SAME

TECHNICAL FIELD

The present invention relates to semiconductor devices and methods for manufacturing the same.

BACKGROUND ART

In a conventional semiconductor device operated at a temperature of less than 200° C., a semiconductor element using Si (silicon) as a base material and a wiring electrode using Al (aluminum) as a main component are used. However, along with increase in the current capacity which flows to the semiconductor device, the semiconductor device is required to operate at a temperature exceeding 200° C. In order to operate the semiconductor device at a temperature exceeding 200° C., a wide bandgap semiconductor has drawn attention as a base material of a semiconductor element. The wide bandgap semiconductor is a semiconductor having a large bandgap and a large dielectric-breakdown electric field compared with Si and is, for example, SiC (silicon carbide), a nitride, diamond, or the like.

Meanwhile, if the semiconductor device using the wiring electrode containing Al as a main component is operated at a temperature exceeding 200° C., there has been a problem that reliability of the semiconductor device is lowered due to, for example, interactions between Al of the wiring electrode and electrodes of the semiconductor element and shape change of the wiring electrode. Therefore, Cu (copper) has drawn attention as a material of a wiring electrode replacing Al. Herein, the semiconductor element and the wiring electrode are covered with an organic resin film for, for example, taking a measure against static electricity in the atmospheric air; however, Cu is easily reacted with an organic resin of the organic resin film before thermosetting. Therefore, a method of forming an inorganic film on the surface of a wiring electrode containing Cu as a main component in order to prevent the reaction with the organic resin before thermosetting is disclosed (for example, Patent Document 1).

PRIOR ART DOCUMENTS

Patent Documents

Patent Document 1: Japanese Patent Application Laid-Open No. 2000-164709

SUMMARY OF INVENTION

Problems to be Solved by the Invention

The wiring electrode is required to be formed thick as the capacity of the current which flows to the semiconductor device is increased. Therefore, a Cu wiring electrode is formed thick by using a plating method to manufacture a semiconductor device. There has been a problem that, when this semiconductor device is operated, for example, at a temperature exceeding 200° C., a diffusion prevention film provided between the Cu wiring electrode and an organic resin film is peeled off from the Cu wiring electrode. The Cu wiring electrode formed by the plating method has gases containing oxygen atoms, etc. therein. When the semiconductor device is operated, these gases are emitted from the inside of the Cu wiring electrode, thereby forming an oxide film between the Cu wiring electrode and the diffusion prevention film. As a result, since the adhesive force between the oxide film and the diffusion prevention film is weak, the diffusion prevention film is peeled off from the Cu wiring electrode.

The present invention has been accomplished in order to solve the above described problems, and it is an object to provide a method for manufacturing a semiconductor device in which reduction of the adhesive force of the Cu wiring electrode to the diffusion prevention film is suppressed.

Means for Solving the Problems

A method for manufacturing a semiconductor device according to the present invention includes: a process of forming a Cu wiring electrode by a plating method above a semiconductor element using a wide bandgap semiconductor as a base material; a reducing process of reducing the Cu wiring electrode under a $NH_3$ atmosphere; a heating process of heating the Cu wiring electrode at the same time as the reducing process; a process of forming a diffusion prevention film covering the Cu wiring electrode after the heating process; and a sealing process of covering the diffusion prevention film with an organic resin film.

Effects of the Invention

According to the method for manufacturing the semiconductor device according to the present invention, the semiconductor device in which reduction of the adhesive force of the Cu wiring electrode to the diffusion prevention film is suppressed can be obtained. The semiconductor device obtained by the method for manufacturing the semiconductor device according to the present invention has: as a manufacturing method, the reducing process of reducing the Cu wiring electrode under the $NH_3$ atmosphere; the heating process of heating the Cu wiring electrode at the same time as the reducing process; and the process of forming the diffusion prevention film covering the Cu wiring electrode after the heating process.

The reducing process reduces the oxide film formed on the surface of the Cu wiring electrode, and the heating process reduces the amounts of the gases containing oxygen atoms, etc. in the Cu wiring electrode. In the semiconductor device manufactured by the method for manufacturing the semiconductor device according to the present invention, the amounts of the gases in the Cu wiring electrode is reduced; therefore, even when the semiconductor device is operated, formation of the oxide film between the Cu wiring electrode and the diffusion prevention film is suppressed, and the reduction of the adhesive force of the Cu wiring electrode to the diffusion prevention film is therefore suppressed. As a result of these, according to the method for manufacturing the semiconductor device according to the present invention, the semiconductor device in which the reduction of the adhesive force of the Cu wiring electrode to the diffusion prevention film is suppressed can be obtained.

BRIEF DESCRIPTION OF DRAWINGS

FIG. 1 is part of a cross-sectional view showing a configuration of a semiconductor device manufactured by a method for manufacturing the semiconductor device according to a first embodiment.

FIG. 19 is a cross-sectional view showing a configuration of a semiconductor device manufactured by a method for manufacturing the semiconductor device according to a fifth embodiment.

DESCRIPTION OF EMBODIMENTS

First Embodiment

Figure 2:
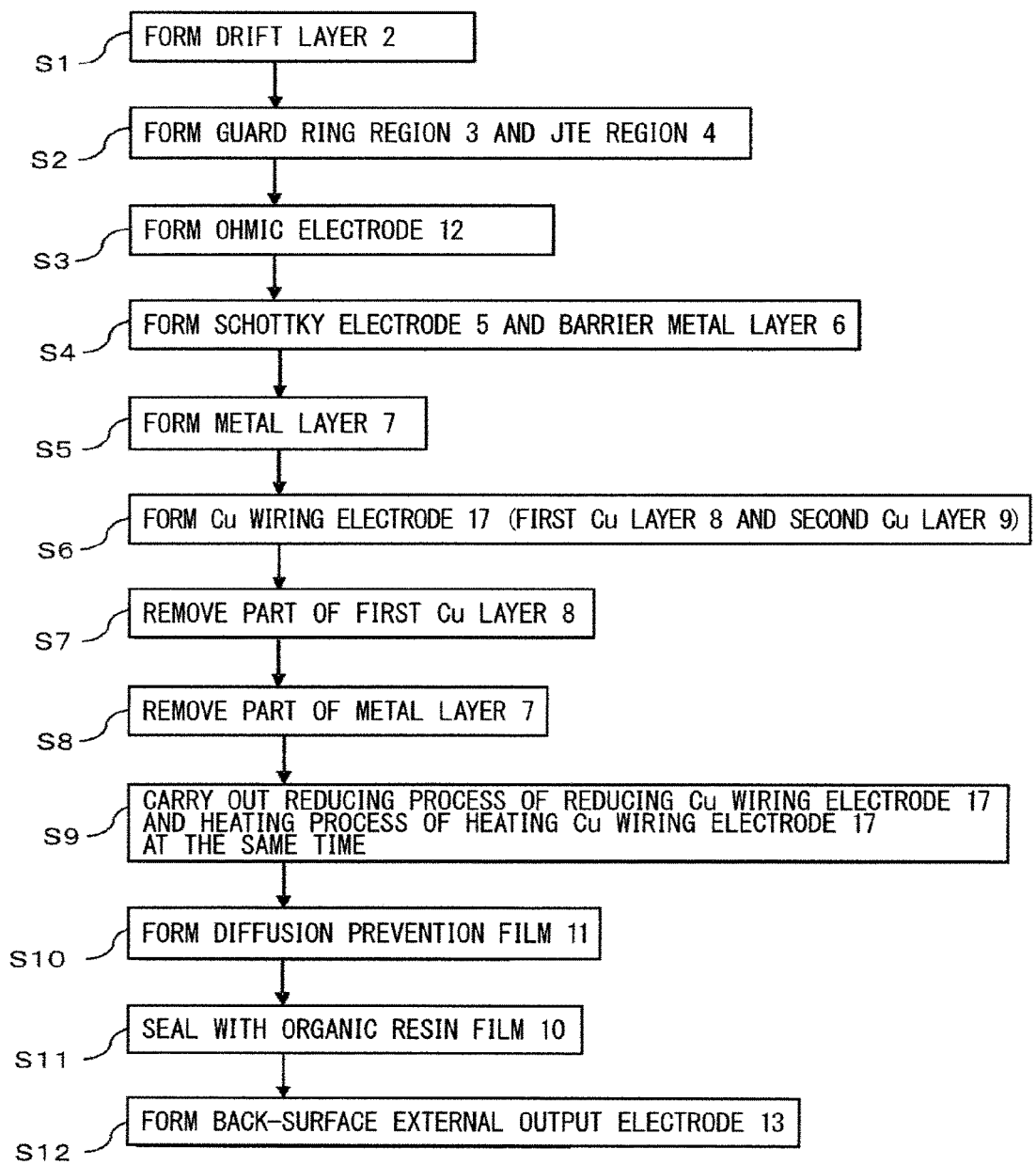
FIG. 2 is a process flow diagram showing the method for manufacturing the semiconductor device according to the first embodiment of the present invention.

First, a configuration of a semiconductor device manufactured by a method for manufacturing a semiconductor device according to a first embodiment of the present invention will be described. FIG. 1 is part of a cross-sectional view showing the configuration of the semiconductor device manufactured by the method for manufacturing the semiconductor device according to the first embodiment of the present invention. FIG. 1 shows only a left half of the cross-sectional view of the semiconductor device. In other words, the cross-sectional view of the semiconductor device manufactured by the method for manufacturing the semiconductor device according to the first embodiment of the present invention includes FIG. 1 and the view of FIG. 1 that is bilaterally symmetrically flipped to the right side.

In the first embodiment of the present invention, a case in which a semiconductor element using SiC, which is a wide bandgap semiconductor, as a base material is used in a semiconductor device is described as an example. The wide bandgap semiconductor is a semiconductor having a larger bandgap and a larger dielectric-breakdown electric-field strength compared with Si. The semiconductor device of FIG. 1 is provided with the semiconductor element 18 using SiC as the base material, a Cu wiring electrode 17 electrically connected to the semiconductor element 18, a diffusion prevention film 11 covering the Cu wiring electrode 17, and an organic resin film 10 covering the diffusion prevention film 11. The Cu wiring electrode 17 is provided with a first Cu layer 8 and a second Cu layer 9. Furthermore, the semiconductor device of FIG. 1 is provided with a metal layer 7 between the semiconductor element 18 and the Cu wiring electrode 17 and is provided with a back-surface external output electrode 13 in a lower surface side which is in the side of the surface opposite to the surface on which the metal electrode 7 of the semiconductor element 18 is formed.

First, outlines of the semiconductor element 18 of the semiconductor device will be described. The semiconductor element 18 is provided with a substrate 1 using n-type SiC, a drift layer 2 above the substrate 1, and a Schottky electrode 5 above the drift layer 2. Furthermore, in a surface layer contacting an upper surface of the drift layer 2, a guard ring region 3 and a JTE (Junction Termination Extension) region 4, which is a junction termination extension region; and a barrier metal layer 6 is provided above the Schottky electrode 5. An ohmic electrode 12 is provided below the substrate 1. Thus, the semiconductor element 18 is a so-called n-type SiC Schottky barrier diode.

The semiconductor element 18 will be described in detail. The substrate 1 uses n-type SiC, and the drift layer 2 is formed on a first-side surface thereof by an epitaxial growth method. In the present description, the side of the substrate 1 in which the drift layer 2 is formed will be described as the upper side. The guard ring region 3 is formed in a ring shape in a top view in the surface layer side contacting the upper surface of the drift layer 2 and relaxes electric fields generated at a terminal part of the semiconductor element 18. The terminal part is a part surrounding the region in which the Schottky electrode 5 corresponding to an active region is formed.

In the present description, when the semiconductor element 18 is viewed from the upper side, the direction from an end of the Schottky electrode 5 toward a center is assumed to be an inner peripheral side, and the direction from the center of the Schottky electrode 5 toward the end is assumed to be an outer peripheral side. The JTE region 4 is formed in the surface layer of the drift layer 2 as well as the guard ring region 3 and is adjacent to an outer-peripheral-side end of the guard ring region 3. The Schottky electrode 5 is formed in the inner peripheral side with respect to the guard ring region 3 when viewed from the upper side so as to cover part of the guard ring region 3. In other words, the guard ring region 3 is formed across an outer-peripheral-side end of the Schottky electrode 5.

The thickness of the Schottky electrode 5 of FIG. 1 is within a range of 100 nm or more and 500 nm or less. The barrier metal layer 6 is formed above the Schottky electrode 5, and the thickness of the barrier metal layer 6 is within a range of 10 nm or more and 200 nm or less. The barrier metal layer 6 is formed in order to prevent diffusion of Cu from the Cu wiring electrode 17 to the Schottky electrode 5. This is for a reason that diffusion of Cu to the Schottky electrode 5 leads to deterioration of electric characteristics of the semiconductor element 18 such as increase of the leak current of the semiconductor element 18. In the barrier metal layer 6, a material such as: a metal such as W (tungsten), Ta (tantalum), Mo (molybdenum), Ti (titanium), or the like; a nitride such as TiN (titanium nitride), TiSiN (silicon nitride titanium), WN (tungsten nitride), TaN (tantalum nitride), or the like; or a metal carbide such as TaC (tantalum carbide) or TiC (titanium carbide) is used.

The metal layer 7 is formed above the barrier metal layer 6. The metal layer 7 is formed in order to further prevent diffusion of Cu from the Cu wiring electrode 17 to the Schottky electrode 5 and in order to improve the adhesive force of the Cu wiring electrode 17 with respect to the Schottky electrode 5. For example, Ti is used as a material of the metal layer 7.

Next, the Cu wiring electrode 17 will be described. As the Cu wiring electrode 17, the first Cu layer 8 and the second Cu layer 9 are formed above the metal layer 7. The first Cu layer 8 is a seed layer for forming the second Cu layer 9 by a plating method, and the second Cu layer 9 is a surface external output electrode. In other words, the second Cu layer 9 is formed above the first Cu layer 8. The Cu wiring electrode 17 uses Cu as a main component. Therefore, in the Cu wiring electrode 17, elemental Cu may be used, or a Cu alloy containing Ni (nickel) or the like may be used.

Meanwhile, the Cu wiring electrode 17 has a thickness of 6 μm or more. In the semiconductor device of FIG. 1, a wide bandgap semiconductor is used as the base material of the semiconductor element 18, wherein the capacity of the current which flows to the semiconductor device is increased compared with a case in which a semiconductor element using Si as a base material is used. Therefore, the capacity of the current which flows to the Cu wiring electrode 17 is also increased, and the Cu wiring electrode 17 requires the thickness of 6 μm or more, for example, from the viewpoints of the maximum permissible current density of Cu and the heat dissipation performance of the Cu wiring electrode 17.

In the first embodiment of the present invention, the diffusion prevention film 11 covers exposed surfaces of the drift layer 2, the Schottky electrode 5, the barrier metal layer 6, the metal layer 7, the first Cu layer 8, and the second Cu layer 9. The diffusion prevention film 11 is formed in order to prevent Cu of the Cu wiring electrode 17 from diffusing to the organic resin film 10. An inorganic compound is used in the diffusion prevention film 11, and the diffusion prevention film 11 is an inorganic film using, for example, a nitride such as $Si_3N_4$ (trisilicon tetranitride), $Si_2N_4$ (disilicon tetranitride), or BN (boron nitride). In the first embodiment of the present invention, a silicon nitride is used in the diffusion prevention film 11.

The thickness of the diffusion prevention film 11 is 30 nm or more. The diffusion prevention film 11 has a tendency that the thickness thereof becomes the thinnest at skirt parts. The skirt parts herein represent the lower parts of a lateral wall part of the diffusion prevention film 11 which are surrounded by broken lines and shown as A-parts in FIG. 1. Therefore, the film thickness of the diffusion prevention film 11 is preferred to be 30 nm or more in the skirt parts.

The organic resin film 10 covers the diffusion prevention film 11. As the organic resin film 10, for example, an epoxy resin such as polyimides or an acrylic resin is used. The thickness of the organic resin film 10 is within a range of 3 μm or more and 100 μm or less.

Furthermore, in the semiconductor device of FIG. 1, part of an upper surface of the second Cu layer 9 is not covered with the diffusion prevention film 11 and the organic resin film 10 and is exposed. For example, a lead for applying a voltage to the semiconductor device is connected to the exposed surface.

At an interface with the diffusion prevention film 11, the Cu wiring electrode 17 of the semiconductor device manufactured by the method for manufacturing the semiconductor device according to the first embodiment of the present invention has more N atoms (nitrogen atoms) than O atoms (oxygen atoms). Moreover, the Cu wiring electrode 17 has the O atoms having a surface density of $1\times10^{14}$ cm$^{-2}$ or less. Also, the Cu wiring electrode 17 has H atoms having a surface density of $1\times10^{15}$ cm$^{-2}$ or less.

Next, the method for manufacturing the semiconductor device according to the first embodiment of the present invention will be described. FIG. 2 is a process flow diagram showing the method for manufacturing the semiconductor device according to the first embodiment of the present invention. First, outlines of the method for manufacturing the semiconductor device according to the first embodiment of the present invention will be described by using FIG. 2. The method for manufacturing the semiconductor device according to the first embodiment of the present invention is provided with the processes of step S1 to step S12 shown in FIG. 2.

The drift layer 2 is formed above the first-side surface of the substrate 1 in step S1 of FIG. 2, the guard ring region 3 and the JTE region 4 are formed in the surface layer of the drift layer 2 in step S2, and the ohmic electrode 12 is formed below the substrate 1 in step S3. Then, the Schottky electrode 5 and the barrier metal layer 6 are formed above the drift layer 2 in step S4 to manufacture the semiconductor element 18. Then, the metal layer 7 is formed above the barrier metal layer 6 in step S5, and the Cu wiring electrode 17 (the first Cu layer 8 and the second Cu layer 9) is formed above the metal layer 7 in step S6. Then, the first Cu layer 8 formed above the drift layer 2 via the metal layer 7 is removed in step S7, and the metal layer 7 formed on the upper surface of the drift layer 2 is removed in step S8.

Then, in step S9, a reducing process of reducing the Cu wiring electrode 17 under a $NH_3$ (ammonia) atmosphere and, at the same time as the reducing process, a heating process of heating the Cu wiring electrode 17 are carried out. Then, the diffusion prevention film 11, which covers the Cu wiring electrode 17, is formed in step S10, and the diffusion prevention film 11 is covered with the organic resin film 10 in step S11. Then, in the end, the back-surface external output electrode 13 is formed below the semiconductor element 18 in step S12.

Figure 3:
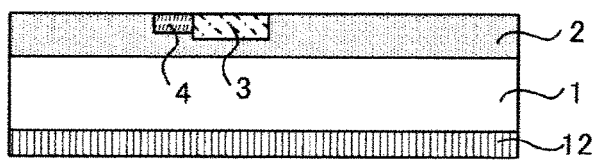
FIG. 3 is part of a cross-sectional view showing the semiconductor device in process of manufacturing describing step S1 to step S3 of the method for manufacturing the semiconductor device according to the first embodiment of the present invention.

Next, the twelve processes of step S1 to step S12 of FIG. 2 will be described in further detail. FIG. 3 is part of a cross-sectional view showing the semiconductor device in process of manufacturing describing step S1 to step S3 of the method for manufacturing the semiconductor device according to the first embodiment of the present invention. FIG. 3 shows only the left half of the cross-sectional view of the semiconductor device in process of manufacturing. Also, FIG. 4 to FIG. 9 described later also show only the left halves of the cross-sectional views of the semiconductor device in process of manufacturing as well as FIG. 3.

First, step S1 will be described. The substrate 1 is a SiC substrate having a high-concentration n-type ($n^+$-type) impurity concentration. In step S1, the drift layer 2, which is a SiC layer having a low-concentration n-type ($n^-$-type) impurity concentration, is formed on the first-side surface of the substrate 1 by the epitaxial growth method.

Then, in step S2, the guard ring region 3 and the JTE region 4 are formed. First, a resist pattern is formed by patterning above the drift layer 2 by photoengraving techniques, and Al ions are implanted to the position of the guard ring region 3 while using this resist pattern as a mask. Furthermore, Al ions are implanted also to the position of the JTE region 4 adjacent to the outer-peripheral-side end of the guard ring region 3. The concentration of the Al ions implanted to the position of the JTE region 4 is lower than the concentration of the Al ions implanted to the guard ring region 3. After the Al ions are implanted to the positions of the guard ring region 3 and the JTE region 4, the resist pattern is removed by, for example, wet treatment using an organic solvent or ashing treatment using oxygen plasma.

Then, in order to activate the Al ions implanted to the position of the guard ring region 3 and the position of the JTE region 4, anneal treatment (heat treatment) is carried out. As a result, the guard ring region 3 and the JTE region 4 are formed in the surface layer side contacting the upper surface of the drift layer 2. Then, the ohmic electrode 12 is formed on a second-side surface of the substrate 1 and below the substrate 1 in step S3. As a result of these, the semiconductor device in process of manufacturing as shown in FIG. 3 can be obtained.

Figure 4:
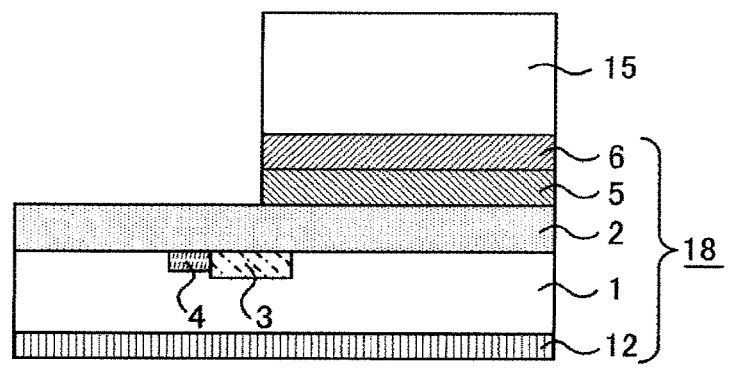
FIG. 4 is part of a cross-sectional view showing the semiconductor device in process of manufacturing describing step S4 of the method for manufacturing the semiconductor device according to the first embodiment of the present invention.

FIG. 4 is part of a cross-sectional view showing the semiconductor device in process of manufacturing describing step S4 of the method for manufacturing the semiconductor device according to the first embodiment of the present invention. In step S4, the Schottky electrode 5 and the barrier metal layer 6 are formed above the drift layer 2. First, as a method of forming the Schottky electrode 5, for example, there is a sputtering method using Ti, Mo, Ni, or the like as a target. The thickness of the Schottky electrode 5 is within a range of 100 nm or more and 500 nm or less. First, a film of the material of the Schottky electrode 5 is formed on the entire upper surface of the drift layer 2 and is formed also on the upper surfaces of the guard ring region 3 and the JTE region 4.

Then, in this case, a film of TiN serving as the material of the barrier metal layer 6 is formed above the material of the Schottky electrode 5, for example, by using a sputtering method. First, the film of the material of the barrier metal layer 6 is formed on the entire upper surface of the Schottky electrode 5. The thickness of the barrier metal layer 6 is within a range of 10 nm or more and 200 nm or less.

Then, as shown in FIG. 4, an etching mask 15 is formed by patterning above the material of the barrier metal layer 6 by photoengraving techniques. The etching mask 15 is formed in a region surrounded by a dotted line in FIG. 4 and is formed so as to cover the part above the part in which the Schottky electrode 5 and the barrier metal layer 6 are desired to be formed. For example, if TiN is used as the material of the barrier metal layer 6, TiN is subjected to wet etching by utilizing the etching mask 15.

After the material of the barrier metal layer 6 is formed into a predetermined shape by wet etching, the material of the Schottky electrode 5 is then subjected to wet etching. For example, if Ti is used as the material of the Schottky electrode 5, Ti is subjected to wet etching by using a solution of diluted hydrofluoric acid and by utilizing the etching mask 15.

After the material of the barrier metal layer 6 and the material of the Schottky electrode 5 are subjected to wet etching, the etching mask 15 is removed by, for example, wet treatment or ashing treatment. As a result of these, the Schottky electrode 5 and the barrier metal layer 6 are formed above the drift layer 2, and the semiconductor device having the configuration excluding the dotted-line part, which is the etching mask 15, from the cross-sectional view shown in FIG. 4 is obtained. The configuration excluding the etching mask 15 from the cross-sectional view shown in FIG. 4 is the semiconductor element 18, which is an n-type SiC Schottky barrier diode. In other words, when the process of step S4 is finished, the semiconductor element 18 of the semiconductor device manufactured by the method for manufacturing the semiconductor device according to the first embodiment of the present invention can be obtained.

Figure 5A:
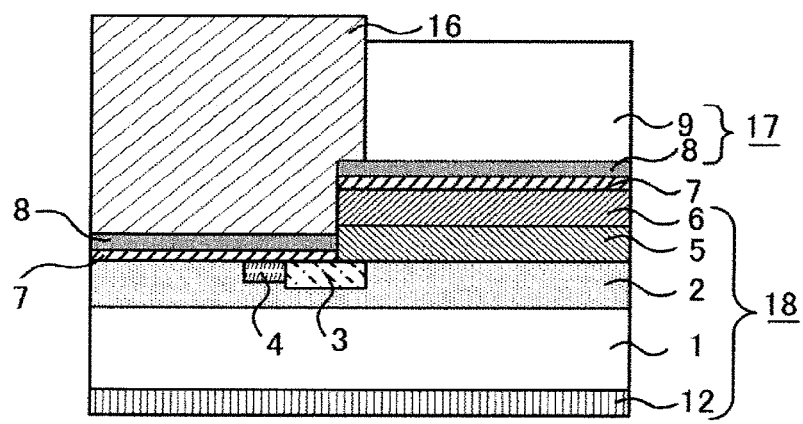
FIGS. 5A and 5B are part of cross-sectional views showing the semiconductor device in process of manufacturing describing step S5 and step S6 of the method for manufacturing the semiconductor device according to the first embodiment of the present invention.
Figure 5B:
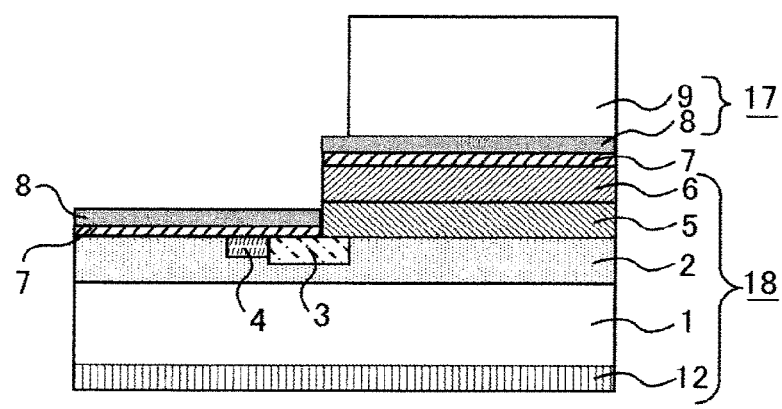

FIGS. 5A and 5B are part of cross-sectional views showing the semiconductor device in process of manufacturing describing step S5 and step S6 of the method for manufacturing the semiconductor device according to the first embodiment of the present invention. FIG. 5A is a view before a resist mask 16 is removed in step S6, and FIG. 5B is a view after it is removed. In step S5, the metal layer 7 is formed above the barrier metal layer 6. The metal layer 7 is formed by, for example, a sputtering method using Ti as a target. In this case, as shown in FIG. 5A, the metal layer 7 is formed also on the upper surface of the drift layer 2. By virtue of this, when the Cu wiring electrode 17 is formed later, the metal layer 7 formed on the upper surface of the drift layer 2 prevents the first Cu layer 8 of the Cu wiring electrode 17 from being directly formed on the upper surface of the drift layer 2.

Then, in step S6, the Cu wiring electrode 17 is formed above the semiconductor element 18 and above the metal layer 7. In other words, the Cu wiring electrode 17 is formed in the upper-surface side of the semiconductor element 18. First, the first Cu layer 8 is formed above the metal layer 7. The first Cu layer 8 is formed by a PVD (Physical Vapor Deposition) method including a thermal deposition method, an electron-beam deposition method, a sputtering method, or the like or by a MOCVD (Metal Organic Chemical Vapor Deposition) method using a gas of organic metal. In the first Cu layer 8, elemental Cu or a Cu alloy is used. The thickness of the first Cu layer 8 is within a range of 100 nm or more and 1000 nm or less.

Then, as shown in FIG. 5A, on the upper surface of the first Cu layer 8, a resist mask 16 for forming the second Cu layer 9 above the first Cu layer 8, which is formed above the Schottky electrode 5 via the barrier metal layer 6 and the metal layer 7, is formed by patterning by photoengraving techniques. As described later, the second Cu layer 9 is not formed in the part in which the resist mask 16 is formed, and an opening part of the resist mask 16 serves as the part in which the second Cu layer 9 is formed.

Then, the second Cu layer 9 is formed above the first Cu layer 8 by a plating method. The second Cu layer 9 is formed on the part of the upper surface of the first Cu layer 8 on which the resist mask 16 is not formed, and the second Cu layer 9 is formed along a lateral wall of the resist mask 16. The thickness of the second Cu layer 9 is within a range of 6 or more and 100 μm or less. Since the second Cu layer 9 is formed by the thickness of 6 μm or more, the layer is formed by using a plating method in consideration of formation time. As a result of these, the semiconductor device in process of manufacturing as shown in FIG. 5A can be obtained.

In the end, the resist mask 16 is removed by, for example, wet treatment or ashing treatment. As a result, the semiconductor device in process of manufacturing as shown in FIG. 5B can be obtained.

Figure 6:
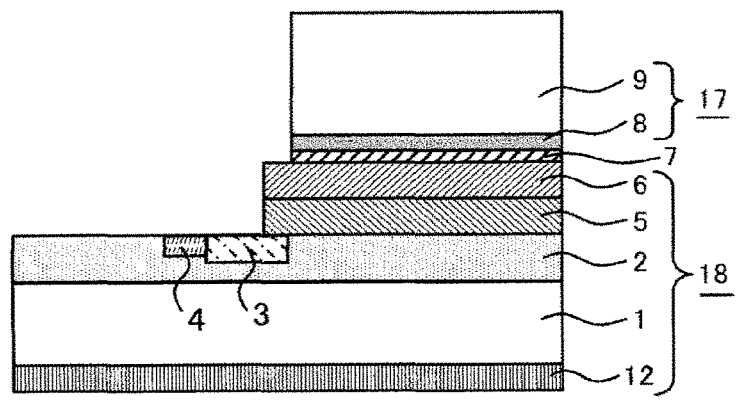
FIG. 6 is part of a cross-sectional view showing the semiconductor device in process of manufacturing describing step S7 and step S8 of the method for manufacturing the semiconductor device according to the first embodiment of the present invention.

FIG. 6 is part of a cross-sectional view showing the semiconductor device in process of manufacturing describing step S7 and step S8 of the method for manufacturing the semiconductor device according to the first embodiment of the present invention. In step S7, the first Cu layer 8 formed on the upper surface of the drift layer 2 via the metal layer 7 is removed by wet etching. Note that, in this process, the exposed region of the Cu wiring electrode 17 (the first Cu layer 8 and the second Cu layer 9) above the barrier metal layer 6 is also exposed to a wet etching solution. Therefore, in the configuration shown in FIG. 5B, the part of the Cu wiring electrode 17 that is exposed to the wet etching solution is etched to some degree.

Then, in step S8, the metal layer 7 formed on the upper surface of the drift layer 2 is removed. First, a mask is formed on the upper surface of the Cu wiring electrode 17 by photoengraving techniques. Then, the metal layer 7 formed on the upper surface of the drift layer 2 is subjected to wet etching with a solution of diluted hydrofluoric acid. As a result of these, the semiconductor device in process of manufacturing as shown in FIG. 6 can be obtained.

Then, in step S9, the reducing process of reducing the Cu wiring electrode 17 under the $NH_3$ atmosphere and, at the same time as the reducing process, the heating process of heating the Cu wiring electrode 17 are carried out. Herein, the semiconductor device in process of manufacturing shown in FIG. 6, in other words, the semiconductor device in process of manufacturing obtained in the process at the point of step S8 will be referred to as a first chip. First, the first chip is placed in, for example, a chamber of a CVD (Chemical Vapor Deposition) apparatus. In step S9, the reducing process of reducing the Cu wiring electrode 17 under the $NH_3$ atmosphere and, at the same time as the reducing process, the heating process of heating the Cu wiring electrode 17 are carried out. However, since time is required to increase the first chip to a predetermined temperature, first, heating of the first chip is started. It is preferred to increase the temperature of the first chip until the temperature of the Cu wiring electrode 17 becomes 150° C. or more. It is further preferred to increase the temperature of the Cu wiring electrode 17 to 300° C. or more. The reasons why the preferred temperature is 150° C. or more or 300° C. or more will be described later. In the first embodiment of the present invention, the temperature of the first chip is set to 300° C.

When the temperature of the first chip reaches 300° C., $NH_3$ is then poured into the chamber of the CVD apparatus while the temperature of the first chip is maintained. Then, at the same time as the pouring of $NH_3$, discharge of the gas in the chamber is also carried out. In the reducing process, it is preferred that the Cu wiring electrode 17 be exposed under the $NH_3$ atmosphere for the time of 15 seconds or more and 120 seconds or less. It is further preferred that the time be 15 seconds or more and 45 seconds or less. The reasons why the preferred time is 15 seconds or more and 120 seconds or less and 15 second or more and 45 seconds or less will be described later.

Figure 7:
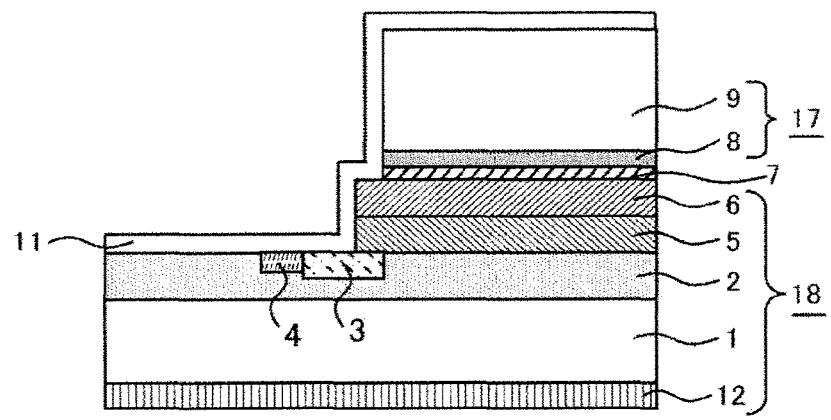
FIG. 7 is part of a cross-sectional view showing the semiconductor device in process of manufacturing describing step S10 of the method for manufacturing the semiconductor device according to the first embodiment of the present invention.

FIG. 7 is part of a cross-sectional view showing the semiconductor device in process of manufacturing describing step S10 of the method for manufacturing the semiconductor device according to the first embodiment of the present invention. In step S10, the diffusion prevention film 11, which covers the Cu wiring electrode 17, is formed. Step S10 is carried out after step S9, in other words, after the heating process. First, as shown in FIG. 7, the exposed surfaces of the Schottky electrode 5, the barrier metal layer 6, the metal layer 7, the Cu wiring electrode 17, and the drift layer 2 are covered with the material of the diffusion prevention film 11.

The diffusion prevention film 11 is a film using an inorganic compound such as silicon nitride, BN, or the like. In the first embodiment of the present invention, since step S9 is carried out by using the CVD apparatus, step S10 also uses the CVD apparatus as it is. More specifically, in the first embodiment of the present invention, the diffusion prevention film 11 is formed by a CVD method.

The thickness of the diffusion prevention film 11 is 30 nm or more. The thickness of the diffusion prevention film 11 becomes thin at the lateral wall parts thereof, particularly, the skirt parts which are the lower parts of the lateral wall parts, and the thicknesses of these parts are 30 nm or more. Note that the thickness of the diffusion prevention film 11 is further preferred to be 400 nm or more. As a result of these, the semiconductor device in process of manufacturing as shown in FIG. 7 can be obtained.

After this, in step S10, a resist pattern is formed above the material of the diffusion prevention film 11 by photoengraving techniques. Then, the material of the diffusion prevention film 11 is subjected to etching by, for example, RIE (Reactive Ion Etching) while using the resist pattern as a mask, thereby exposing part of the upper surface of the second Cu layer 9. Then, in the end, the resist pattern is removed by, for example, wet treatment or ashing treatment.

Figure 8:
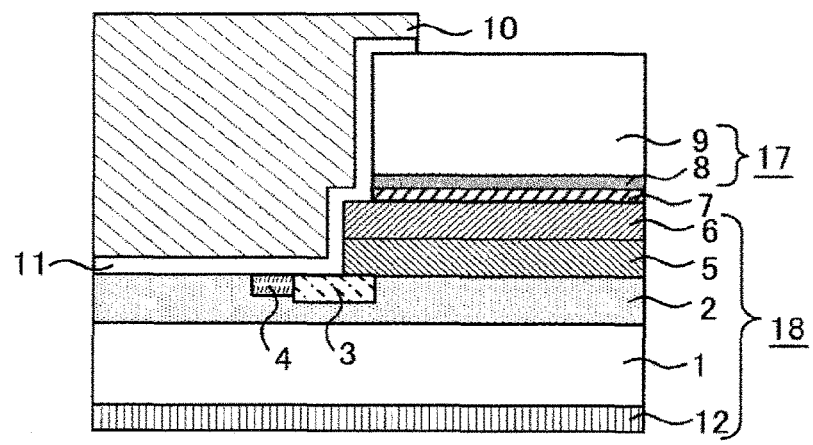
FIG. 8 is part of a cross-sectional view showing the semiconductor device in process of manufacturing describing the method up to step S11 for manufacturing the semiconductor device according to the first embodiment of the present invention.

FIG. 8 is part of a cross-sectional view showing the semiconductor device in process of manufacturing describing step S11 of the method for manufacturing the semiconductor device according to the first embodiment of the present invention. Step S11 is a sealing process of covering the diffusion prevention film 11 with the organic resin film 10. First, the material of the organic resin film 10 is formed so as to cover the upper surfaces of the diffusion prevention film 11 and the exposed second Cu layer 9. As the organic resin film 10, for example, an epoxy resin or an acrylic resin is used. The organic resin film 10 is formed, for example, by a spin coating method, and the thickness of the organic resin film 10 is within a range of 3 μm or more and 100 μm or less.

Herein, if the film thickness of the diffusion prevention film 11 is thinner than 30 nm in the case in which the thickness of the organic resin film 10 is within the range of 3 μm or more and 100 μm or less, a crack(s) may be generated in the diffusion prevention film 11 due to the stress of the organic resin film 10. If the crack(s) is generated, Cu of the Cu wiring electrode 17 may diffuse into the organic resin film 10 through the crack(s). Therefore, the thickness of the diffusion prevention film 11 is desired to be 30 nm or more.

Then, a resist pattern is formed above the material of the organic resin film 10 by photoengraving techniques. Then, etching is carried out while using the resist pattern as a mask, thereby forming an opening part of the organic resin film 10 and exposing part of the upper surface of the second Cu layer 9. As a result of these, the semiconductor device in process of manufacturing as shown in FIG. 8 can be obtained.

Note that, in the first embodiment of the present invention, the etching of the material of the diffusion prevention film 11 and the material of the organic resin film 10 is separately carried out. It is also conceivable to form the material of the diffusion prevention film 11, apply the material of the organic resin film 10, and then carry out etching while a common resist pattern is used as a mask. In this case, the number of etching processes can be reduced by one. However, in this case, sufficient cleaning cannot be carried out since the common resist pattern is present after the etching process of the material of the organic resin film 10, and, when the etching process of the material of the diffusion prevention film 11 is to be carried out, malformation of the pattern of the diffusion prevention film 11 may occur due to incorporation of a foreign matter(s). Therefore, attention has to be paid.

In the end, in step S12, the back-surface external output electrode 13 is formed below the semiconductor element 18. As the back-surface external output electrode 13, a stack of elemental Ti and an alloy of Ni and Au (gold) is used. Other than that, a stack of materials containing Ti and Cu by a plating method may be used. Note that Ti can be omitted since it is provided in order to improve the adhesive force between stacked films in the back-surface external output electrode 13. Since the back-surface external output electrode 13 is only required to be formed below the semiconductor element 18, a layer for improving the adhesive force between the back-surface external output electrode 13 and the semiconductor element 18 may be separately provided between the semiconductor element 18 and the back-surface external output electrode 13.

As a result of these, the semiconductor device as shown in FIG. 1 can be obtained.

In the first embodiment of the present invention, by employing the manufacturing method as described above, the semiconductor device in which reduction of the adhesive force of the Cu wiring electrode 17 to the diffusion prevention film 11 is suppressed can be obtained. Hereinafter, the semiconductor device manufactured by the method for manufacturing the semiconductor device according to the first embodiment of the present invention will be simply referred to as the semiconductor device of the first embodiment of the present invention. Since the semiconductor device of the first embodiment of the present invention provides step S9 in the manufacturing method, reduction of the adhesive force of the Cu wiring electrode 17 to the diffusion prevention film 11 is suppressed.

At the point when the process of step S8 is finished, an oxide film of, for example, $Cu_2O$ or $CuO$ is often formed on the surface of the Cu wiring electrode 17. In other words, the oxide film is formed on the surface of the Cu wiring electrode 17 of the first chip. This is for a reason that, since Cu of the Cu wiring electrode 17 is easily bonded with O atoms, Cu of the surface of the Cu wiring electrode 17 is bonded with the O atoms in the atmospheric air, for example, when the resist mask 16 is removed in step S6 or when a transition is made from step S6 to step S7. The oxide film on the surface of the Cu wiring electrode 17 has weak adhesive force with the diffusion prevention film 11 and becomes a cause that reduces the adhesive force of the Cu wiring electrode 17 to the diffusion prevention film 11.

When the first chip in which the oxide film is formed on the surface of the Cu wiring electrode 17 is placed under the $NH_3$ atmosphere in the reducing process of step S9, chemical reactions that the O atoms of the oxide film are bonded with the H atoms of $NH_3$ and become $H_2O$ (water vapor) occur at the surface of the Cu wiring electrode 17. In other words, the oxide film on the surface of the Cu wiring electrode 17 is reduced.

In the first embodiment of the present invention, first, before the Cu wiring electrode 17 is covered with the diffusion prevention film 11, the oxide film formed on the Cu wiring electrode 17 can be reduced by the reducing process of step S9 at the point when the process of step S8 is finished. Therefore, at the point when the Cu wiring electrode 17 is covered with the diffusion prevention film 11 there is no oxide film between the Cu wiring electrode 17 and the diffusion prevention film 11, and reduction of the adhesive force of the Cu wiring electrode 17 to the diffusion prevention film 11 is suppressed in the semiconductor device of the first embodiment of the present invention.

Furthermore, in the first embodiment of the present invention, the heating process is also carried out at the same time as the reducing process. The Cu wiring electrode 17 which has been formed by a plating method and is at a point before step S9 is carried out contains gases of, for example, O atoms, H atoms, $H_2O$, and $CO_2$. These gases are the gases which are emitted from the inside of the Cu wiring electrode 17, for example, when the semiconductor device is operated, and the gases affect the adhesive force of the Cu wiring electrode 17 to the diffusion prevention film 11. The heating process desorbs these gases from the Cu wiring electrode 17 from which the oxide film has been reduced by the reducing process of step S9.

Herein, a case in which only the reducing process is carried out without carrying out the heating process as the treatment for the Cu wiring electrode 17 in step S9 will be considered. In this case, the Cu wiring electrode 17 formed to be thick by the plating method in order to increase the current capacity which flows to the semiconductor device keeps containing the gases of, for example, O atoms, H atoms, OH groups, $H_2O$, and $CO_2$. The Cu wiring electrode 17 which keeps containing the gases therein will be hereinafter referred to as the unheated Cu wiring electrode. When the semiconductor device provided with the unheated Cu wiring electrode is operated, the gases of, for example, O atoms, H atoms, OH groups, $H_2O$, and $CO_2$ are emitted from the inside of the unheated Cu wiring electrode since the unheated Cu wiring electrode is placed under a high temperature.

The O atoms emitted from the inside of the unheated Cu wiring electrode are bonded with Cu of the unheated Cu wiring electrode and form an oxide film on the surface of the unheated Cu wiring electrode. The OH groups and $H_2O$ emitted from the inside of the unheated Cu wiring electrode are bonded with Cu of the unheated Cu wiring electrode and, first, form $Cu(OH)_2$ on the surface of the unheated Cu wiring electrode. Then, because of the heat caused by the operation of the semiconductor device, $Cu(OH)_2$ is easily decomposed to CuO and $H_2O$ and forms an oxide film on the surface of the unheated Cu wiring electrode.

The H atoms emitted from the inside of the unheated Cu wiring electrode are the lightest atoms, therefore act to be desorbed from the surface of the unheated Cu wiring electrode, and peels off the diffusion prevention film 11 from the Cu wiring electrode. Also, $CO_2$ emitted from the inside of the unheated Cu wiring electrode act to peel off the diffusion prevention film 11 and be desorbed from the Cu wiring electrode. Since $CO_2$ contained in the unheated Cu wiring electrode is extremely large compared with the other gases as shown by later-described FIG. 13, the $CO_2$ has large force to peel off the diffusion prevention film 11.

Thus, the gases emitted from the inside of the unheated Cu wiring electrode form the oxide film between the unheated Cu wiring electrode and the diffusion prevention film 11 or peels off the diffusion prevention film 11 from the unheated Cu wiring electrode. Therefore, in the semiconductor device provided with the unheated Cu wiring electrode, the adhesive force of the unheated Cu wiring electrode to the diffusion prevention film 11 is reduced when the semiconductor device is operated.

On the other hand, in the semiconductor device of the first embodiment of the present invention, the gases contained in the Cu wiring electrode 17 are desorbed in step S9; therefore, when the semiconductor device is operated, reduction of the adhesive force of the Cu wiring electrode 17 to the diffusion prevention film 11 caused by desorption of the gases in the Cu wiring electrode 17 is suppressed. Since the amount of the gases in the Cu wiring electrode 17 is reduced, when the semiconductor device of the first embodiment of the present invention is operated, formation of the oxide film between the Cu wiring electrode 17 and the diffusion prevention film 11 and peel-off of the diffusion prevention film 11 from the Cu wiring electrode 17 are suppressed.

In the above description, it has been described that the gases are emitted from the inside of the unheated Cu wiring electrode when the semiconductor device provided with the unheated Cu wiring electrode is operated; however, also in the sealing process of covering the diffusion prevention film 11 with the organic resin film 10, the gases are sometimes emitted from the inside of the unheated Cu wiring electrode. This is for a reason that, if a thermosetting resin is used as the organic resin film 10, in the sealing process of covering the diffusion prevention film 11 with the organic resin film 10, the gases are sometimes emitted from the inside of the unheated Cu wiring electrode since the unheated Cu wiring electrode is affected by the heat when the organic resin film 10 is hardened.

Therefore, in the first embodiment of the present invention, not only when the semiconductor device is operated, but also in the sealing process of covering the diffusion prevention film 11 with the organic resin film 10, formation of the oxide film between the Cu wiring electrode 17 and the diffusion prevention film 11 and peel-off of the diffusion prevention film 11 from the Cu wiring electrode 17 are suppressed.

As described above, in the semiconductor device of the first embodiment of the present invention, reduction of the adhesive force of the Cu wiring electrode 17 to the diffusion prevention film 11 is suppressed.

Meanwhile, the semiconductor device of the first embodiment of the present invention cannot be obtained if the treatment for the Cu wiring electrode 17 in step S9 is only heating treatment. This is for a reason that, if the reducing treatment of the surface of the Cu wiring electrode 17 is not carried out, the oxide film on the surface of the Cu wiring electrode 17 disturbs the gases from being desorbed from the inside of the Cu wiring electrode 17 by the heating treatment, and the gases cannot be desorbed from the inside of the Cu wiring electrode 17. Therefore, in order to obtain the semiconductor device of the first embodiment of the present invention, both of the process of reducing the Cu wiring electrode 17 under the $NH_3$ atmosphere and the heating process of heating have to be carried out in step S9.

Moreover, formation of the diffusion prevention film 11 on the Cu wiring electrode 17 before the gases are desorbed from the Cu wiring electrode 17 has to be avoided. This is for a reason that, if the diffusion prevention film 11 is formed on the Cu wiring electrode 17 before the gases are desorbed from the Cu wiring electrode 17, the diffusion prevention film 11 disturbs desorption of the gases from the inside of the Cu wiring electrode 17 by the heating treatment.

FIG. 9 to FIG. 13 are graphs showing, separately by gases, the results of thermal desorption gas spectrometry (TDS: Thermal Desorption Spectrometry) carried out for Cu wiring electrodes formed by a plating method. The Cu wiring electrodes subjected to TDS are formed by using the same method as step S6 of the method for manufacturing the semiconductor device according to the first embodiment of the present invention and are not subjected to a reducing process and a heating process as shown in step S9. Hereinafter, the Cu wiring electrodes subjected to TDS will be referred to as untreated Cu wiring electrodes. In FIG. 9 to FIG. 13, the untreated Cu wiring electrodes are heated under a vacuum atmosphere, and the ion intensities I [A] of generated gases are detected by current values and are shown with respective temperatures T [° C.]. A temperature increase rate in this case is 1° C./second.

Figure 9:
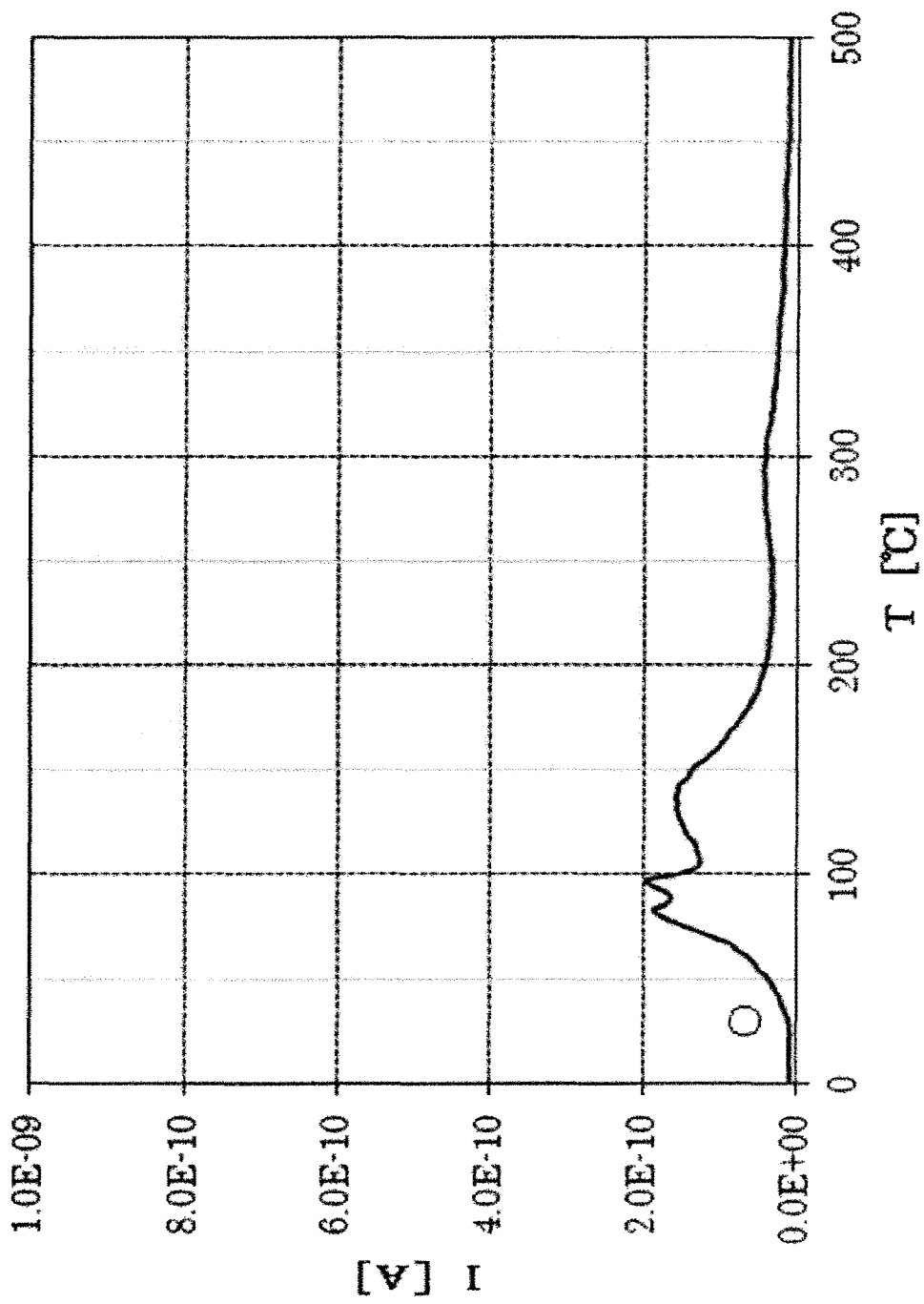
FIG. 9 is a graph showing results for O atoms among the results of TDS carried out for Cu wiring electrodes formed by a plating method.
Figure 10:
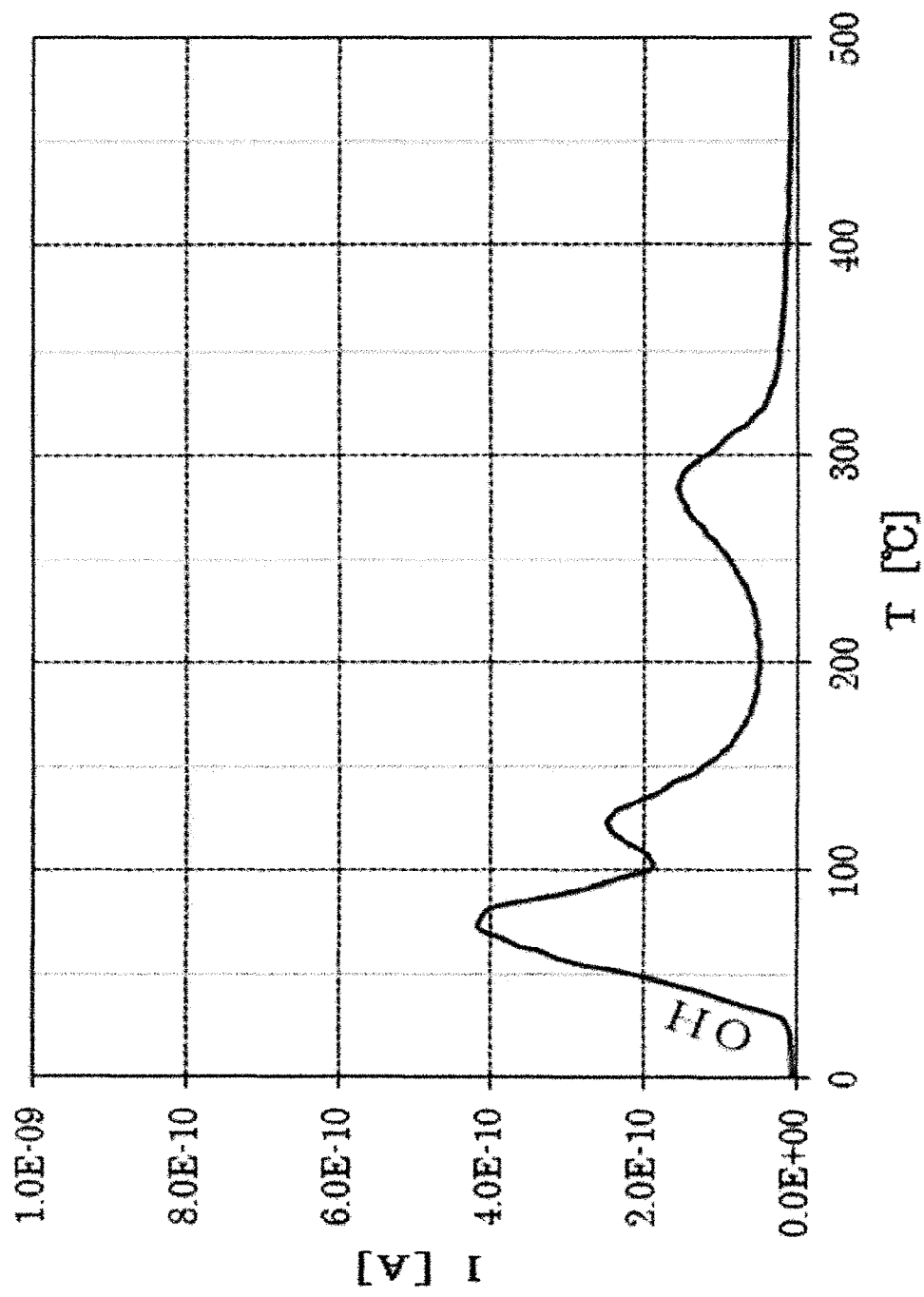
FIG. 10 is a graph showing results for OH groups among the results of TDS carried out for the Cu wiring electrodes formed by the plating method.
Figure 11:
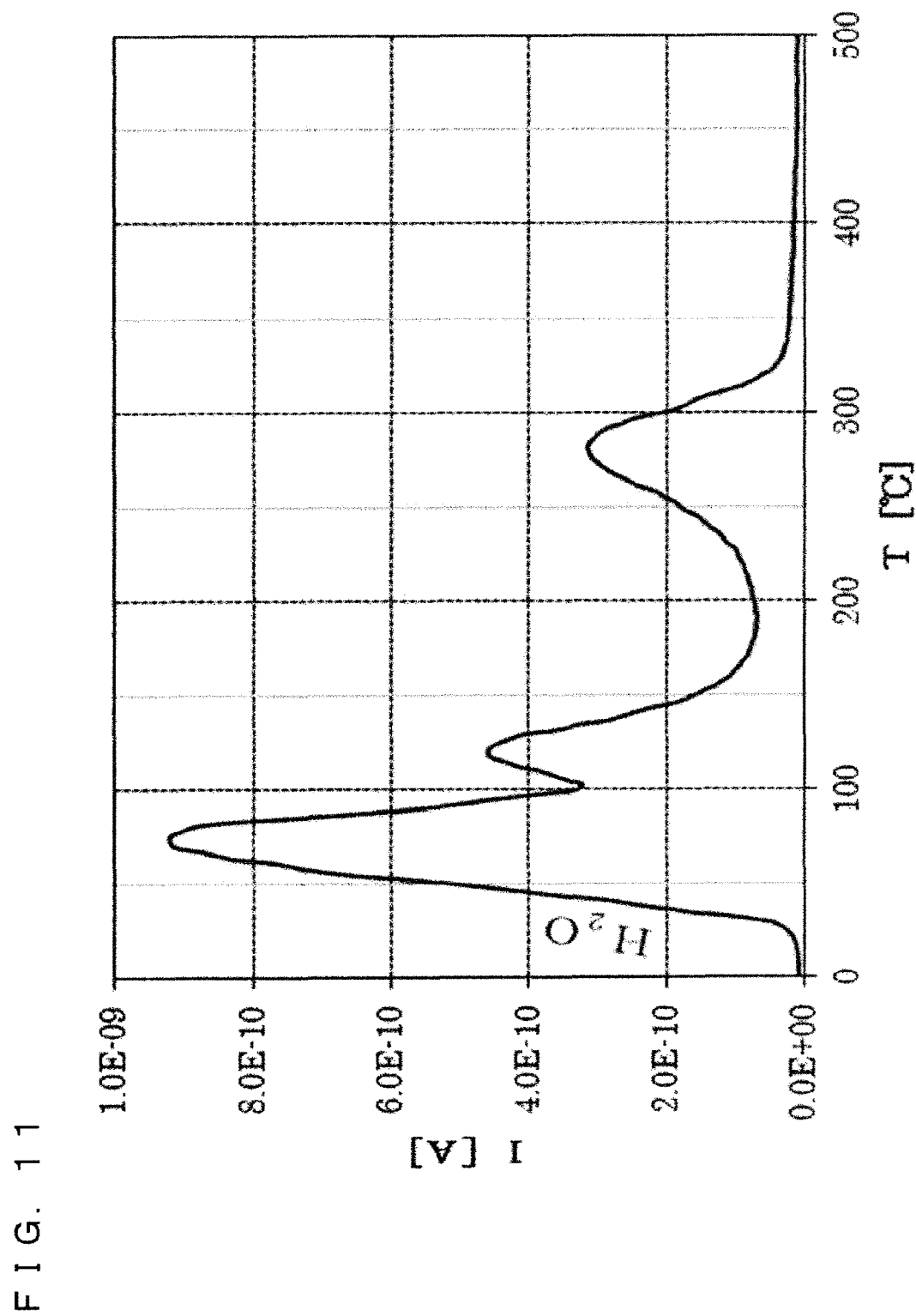
FIG. 11 is a graph showing results for $H_2O$ among the results of TDS carried out for the Cu wiring electrodes formed by the plating method.
Figure 12:
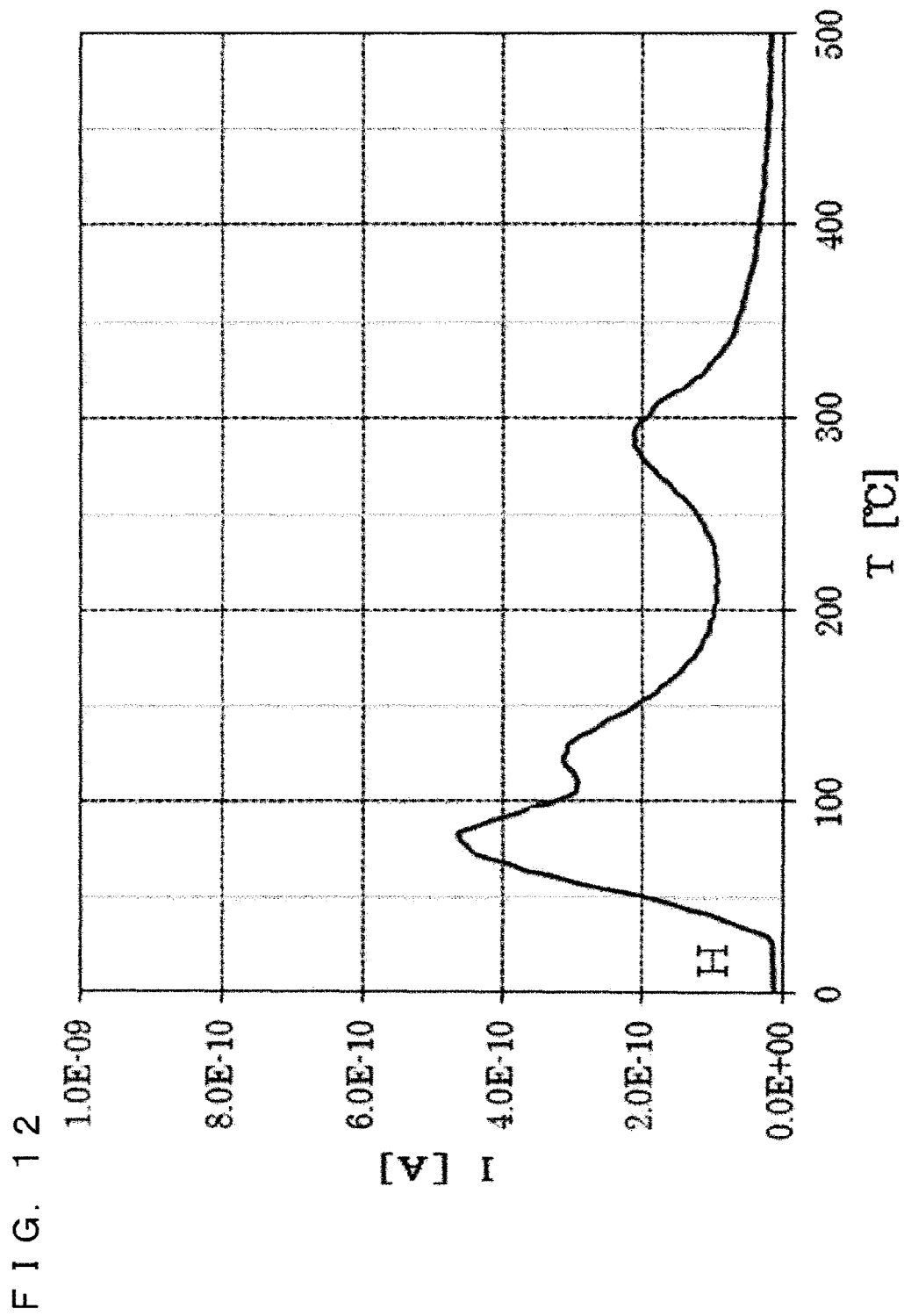
FIG. 12 is a graph showing results for H atoms among the results of TDS carried out for the Cu wiring electrodes formed by the plating method.
Figure 13:
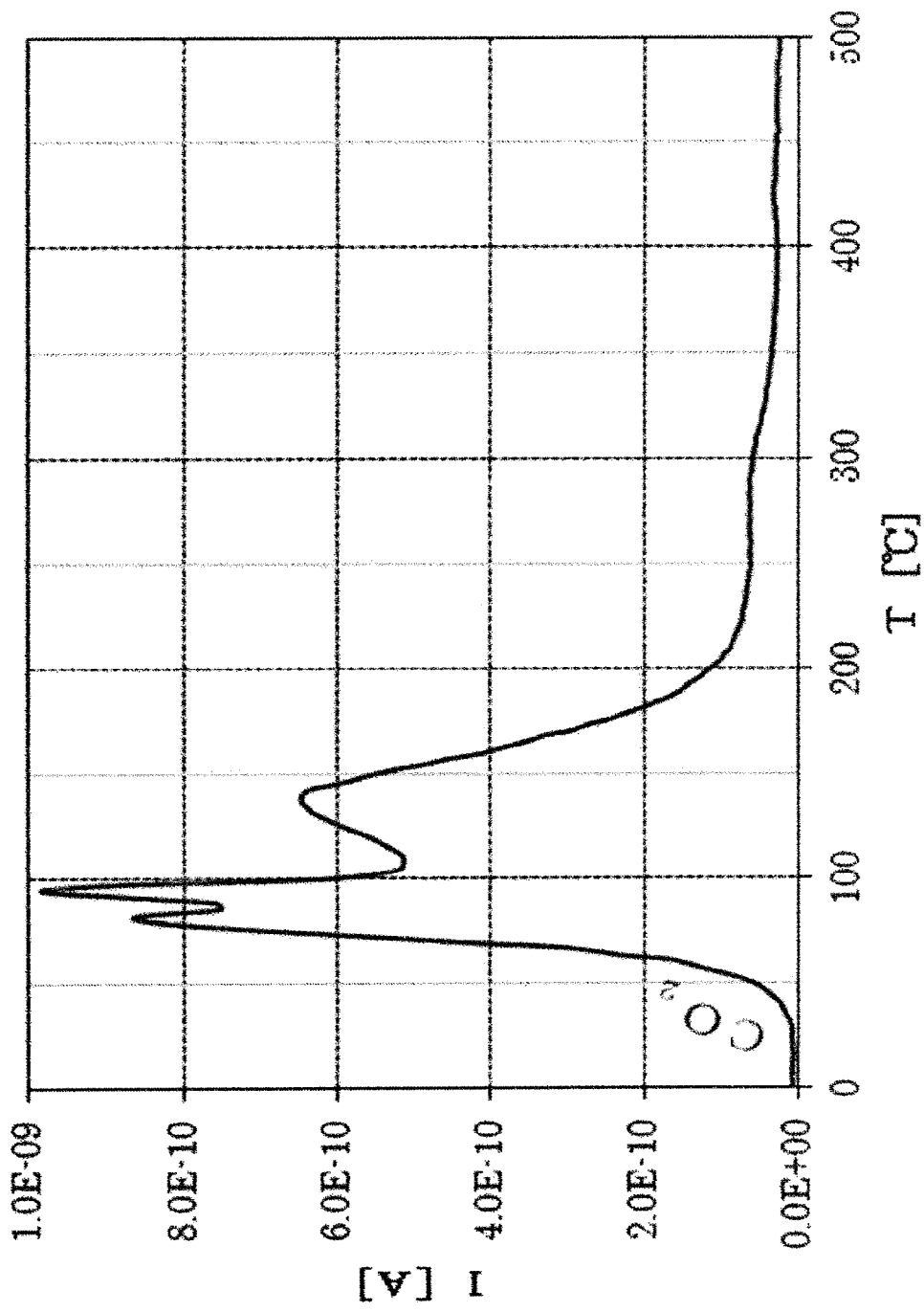
FIG. 13 is a graph showing results for $CO_2$ among the results of TDS carried out for the Cu wiring electrodes formed by the plating method.

Among the results of TDS carried out for the untreated Cu wiring electrodes, FIG. 9 is a graph showing the results for O atoms, FIG. 10 is a graph showing the results for OH groups, FIG. 11 is a graph showing the results for $H_2O$, FIG. 12 is a graph showing the results for H atoms, and FIG. 13 is a graph showing the results for $CO_2$ (carbon dioxide). The gases shown from FIG. 9 to FIG. 13 are the gases which are emitted from the inside of the Cu wiring electrode 17, for example, when the semiconductor device is operated and affect the adhesive force of the diffusion prevention film 11 to the Cu wiring electrode 17. In the graphs of FIG. 9 to FIG. 13, the area of the part surrounded by a curve connecting the points of the ion intensities detected respectively at the temperatures, in other words, a total integral intensity expresses the total ion amount of the gas contained in the Cu wiring electrode.

For example, if the Cu wiring electrode is heated to X° C., the gas of the amount corresponding to the area of the part surrounded by the curve, which connects the points of the ion intensities detected respectively at the temperatures until the Cu wiring electrode reaches X° C., and a vertical line representing X° C. is desorbed from the inside of the Cu wiring electrode. In FIG. 9, in this case, if the Cu wiring electrode is heated to 150° C., about half of the O atoms contained in the Cu wiring electrode is desorbed from the Cu wiring electrode. Then, when the Cu wiring electrode is heated to 300° C., it can be understood that about 90% of the O atoms contained in the Cu wiring electrode are desorbed from the Cu wiring electrode.

This is similar also in FIG. 10; wherein, when the Cu wiring electrode is heated to 150° C., about half of the OH groups contained in the Cu wiring electrode is desorbed from the Cu wiring electrode. Then, when the Cu wiring electrode is heated to 300° C., about 90% of the OH groups contained in the Cu wiring electrode are desorbed from the Cu wiring electrode. Moreover, this is also similar in FIG. 11; wherein, when the Cu wiring electrode is heated to 150° C., half or more of $H_2O$ contained in the Cu wiring electrode are desorbed from the Cu wiring electrode. Then, when the Cu wiring electrode is heated to 300° C., about 90% of $H_2O$ contained in the CU wiring electrode are desorbed from the Cu wiring electrode.

Furthermore, this is also similar in FIG. 12; wherein, when the Cu wiring electrode is heated to 150° C., about half of the H atoms contained in the Cu wiring electrode are desorbed from the Cu wiring electrode. Then, when the Cu wiring electrode is heated to 300° C., about 90% of the H atoms contained in the Cu wiring electrode are desorbed from the Cu wiring electrode. This is also similar in FIG. 13; wherein, when the Cu wiring electrode is heated to 150° C., half or more of $CO_2$ contained in the Cu wiring electrode is desorbed from the Cu wiring electrode. Then, when the Cu wiring electrode is heated to 300° C., about 90% of $CO_2$ contained in the Cu wiring electrode are desorbed from the Cu wiring electrode.

The reasons why the temperature of the Cu wiring electrode 17 is preferred to be increased to 150° C. or more in step S9 are that these are the temperatures at which the amounts of the gases of the O atoms, OH groups, and $H_2O$ which cause formation of an oxide film on the surface of the Cu wiring electrode 17 can be reduced to about half. As a result of reducing the amounts of the gases of O atoms, OH groups, and $H_2O$ contained in the Cu wiring electrode 17 to about half, when the semiconductor device is operated, formation of the oxide film on the surface of the Cu wiring electrode 17 by the gas emitted from the inside of the Cu wiring electrode 17 can be sufficiently suppressed. Moreover, when the temperature of the Cu wiring electrode 17 is increased to 150° C. or more, the amounts of the gases of the H atoms and $CO_2$ which cause peel-off of the diffusion prevention film 11 from the Cu wiring electrode 17 can be also reduced to about half. Therefore, as a result of reducing the amounts of the gases of the H atoms and $CO_2$ contained in the Cu wiring electrode 17 to about half, when the semiconductor is operated, peel-off of the diffusion prevention film 11 from the Cu wiring electrode 17 can be sufficiently suppressed.

The reasons why the temperature of the Cu wiring electrode 17 is preferred to be increased to 300° C. or more are that these are the temperatures at which about 90% of the gases of the O atoms, OH groups, and $H_2O$ which cause formation of the oxide film on the surface of the Cu wiring electrode 17 are desorbed. As a result of desorbing about 90% of the gases of the O atoms, OH groups, and $H_2O$ contained in the Cu wiring electrode 17, when the semiconductor device is operated, formation of the oxide film on the surface of the Cu wiring electrode 17 by the gases emitted from the inside of the Cu wiring electrode 17 is further suppressed. Moreover, when the temperature of the Cu wiring electrode 17 is increased to 300° C. or more, about 90% of the gases of the H atoms and $CO_2$ which cause peel-off of the diffusion prevention film 11 from the Cu wiring electrode 17 can be also desorbed. As a result of desorbing about 90% of the gases of the H atoms and $CO_2$ contained in the Cu wiring electrode 17, when the semiconductor device is operated, peel-off of the diffusion prevention film 11 from the Cu wiring electrode 17 is further suppressed.

Figure 14:
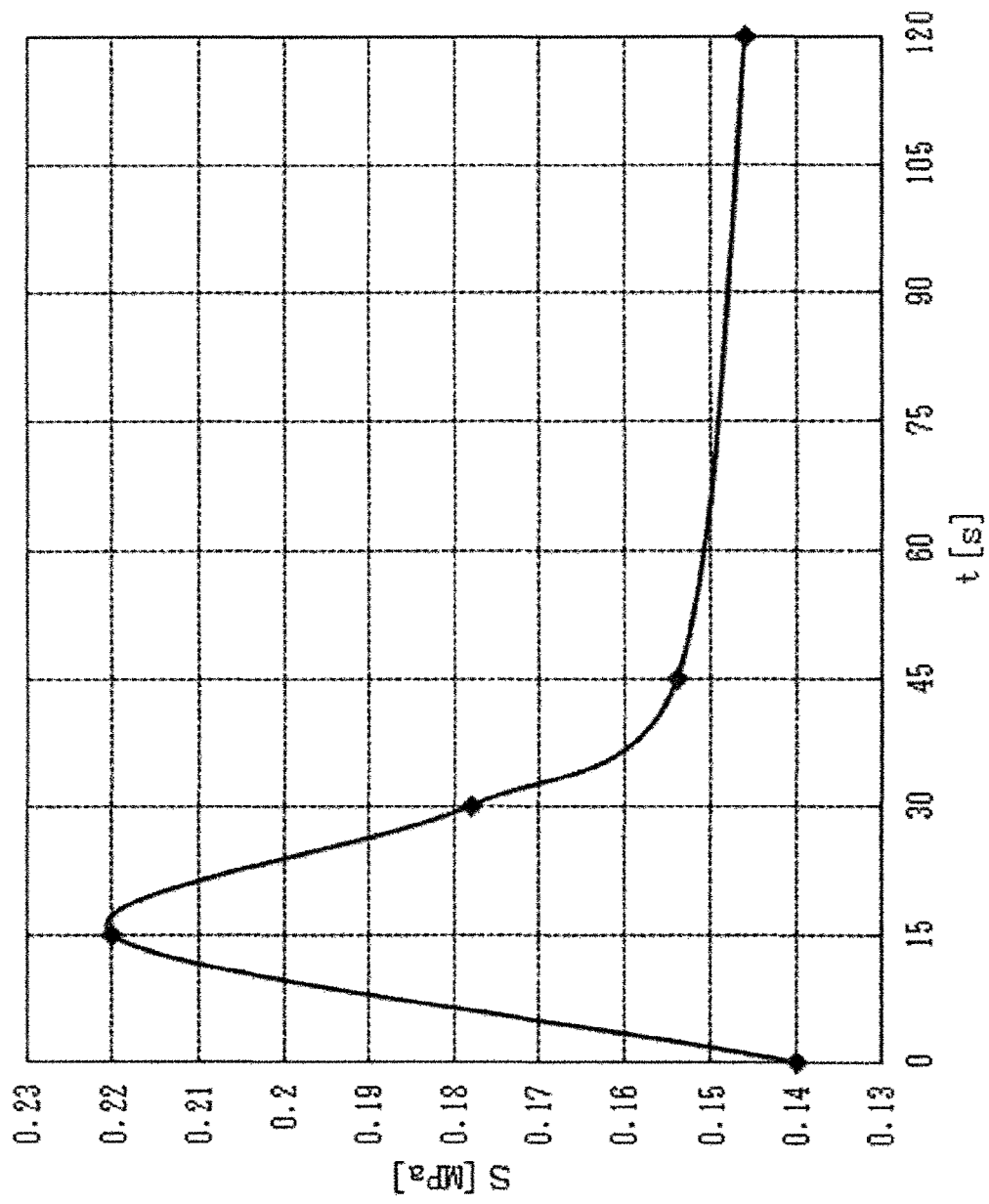
FIG. 14 is a graph showing the relation between the time of exposing a Cu wiring electrode under a $NH_3$ atmosphere and the adhesive force of a diffusion prevention film to the Cu wiring electrode.

FIG. 14 is a graph showing the relation between time t [s] of exposing the Cu wiring electrode 17 under the $NH_3$ atmosphere and the adhesive force S [MPa] of the diffusion prevention film 11 to the Cu wiring electrode 17. The adhesive force of the diffusion prevention film 11 to the Cu wiring electrode 17 is test results checked by using a mELT (modified Edge Liftoff Test) method. It is checked by stripping off the diffusion prevention film 11 by applying an epoxy resin onto the diffusion prevention film 11 and stripping off the diffusion prevention film 11 by the shear force caused by a difference between the heat contraction rates of the epoxy resin and the diffusion prevention film 11. For example, if the time of exposing the Cu wiring electrode under the $NH_3$ atmosphere is 0 second, the adhesive force is 0.140 MPa. This means that the diffusion prevention film 11 is peeled off from the Cu wiring electrode 17 when the force of 0.140 MPa is applied to the diffusion prevention film 11.

According to the graph shown in FIG. 14, it can be understood that, if the time of exposing the Cu wiring electrode 17 under the $NH_3$ atmosphere is 15 seconds or more and 120 seconds or less, the adhesive force is improved more than the case in which the time of exposing the Cu wiring electrode 17 under the $NH_3$ atmosphere is 0 second, in other words, the case in which step S9 of the first embodiment of the present invention is not carried out for the Cu wiring electrode 17. Moreover, according to the graph shown in FIG. 14, it can be understood that the time of exposing the Cu wiring electrode 17 under the $NH_3$ atmosphere is further preferred to be 15 seconds or more and 45 seconds or less.

The reason why the time of exposing the Cu wiring electrode 17 under the $NH_3$ atmosphere is preferred to be 15 seconds or more and 120 seconds or less is that it has been found out from the test results that the adhesive force is reliably improved more than the case in which the time of exposing the Cu wiring electrode under the $NH_3$ atmosphere is 0 second, in other words, the case in which step S9 of the first embodiment of the present invention is not carried out for the Cu wiring electrode 17. The reason why the time of exposing the Cu wiring electrode 17 under the $NH_3$ atmosphere is preferred to be 15 seconds or more and 45 seconds or less is that it has been understood from the test results that the improvement rate of the adhesive force is high.

In the first embodiment of the present invention, when the surface of the Cu wiring electrode 17 is reduced in step S9, N atoms derived from $NH_3$ used in the reducing process are attached to the surface of the Cu wiring electrode 17. This is for a reason that, in the reducing process of the Cu wiring electrode 17, the H atoms of $NH_3$ react with the O atoms of the oxide film and are discharged as $H_2O$, and the N atoms of $NH_3$ attach to the surface of the Cu wiring electrode 17. Meanwhile, the oxide film has been removed from the surface of the Cu wiring electrode 17. Then, step S10 is carried out subsequently to step S9.

Therefore, since the diffusion prevention film 11, which covers the Cu wiring electrode 17, is formed while more N atoms are present than O atoms on the surface of the Cu wiring electrode 17, the Cu wiring electrode 17 has more N atoms than O atoms at the interface with the diffusion prevention film 11.

Figure 15:
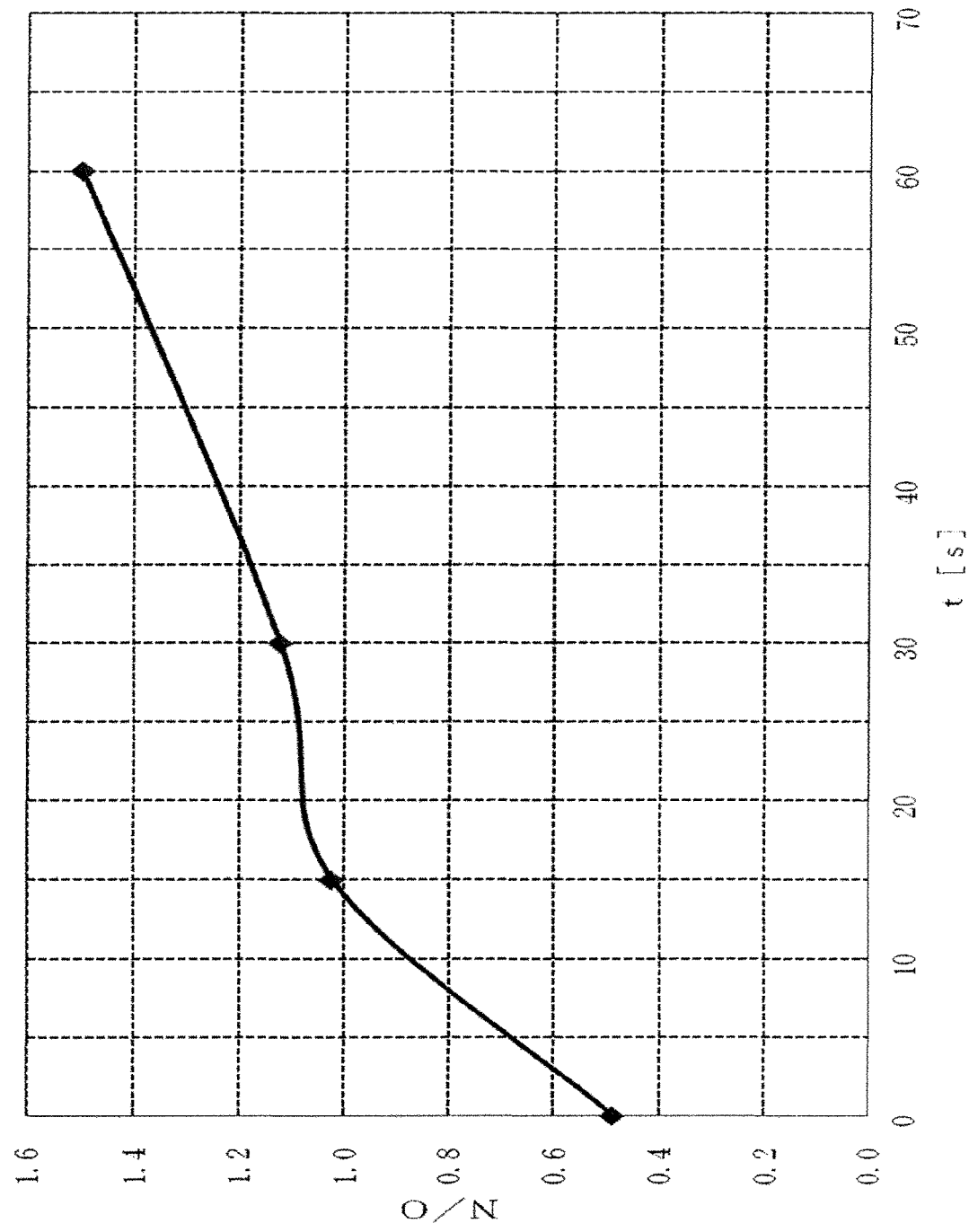
FIG. 15 is a graph showing the relation between the time of exposing the Cu wiring electrode under the $NH_3$ atmosphere and N/O at an interface between the Cu wiring electrode and the diffusion prevention film.

FIG. 15 is a graph showing the relation between the time t [s] of exposing the Cu wiring electrode 17 under the $NH_3$ atmosphere and N/O (the number of N atoms with respect to O atoms) at the interface between the Cu wiring electrode 17 and the diffusion prevention film 11. N/O at the interface between the Cu wiring electrode 17 and the diffusion prevention film 1 is calculated by peeling off the diffusion prevention film 11 from the Cu wiring electrode 17 and carrying out componental analysis by XPS (X-ray Photoelectron Spectroscopy).

According to the graph shown in FIG. 15, it can be understood that the number of the N atoms with respect to the O atoms at the interface between the Cu wiring electrode 17 and the diffusion prevention film 11 is increased when step S9 of the first embodiment of the present invention is carried out for the Cu wiring electrode 17 compared with the case in which the time of exposing the Cu wiring electrode 17 under the $NH_3$ atmosphere is 0 second, in other words, the case in which step S9 of the first embodiment of the present invention is not carried out for the Cu wiring electrode 17. It can be understood that, as the time of exposing the Cu wiring electrode 17 under the $NH_3$ atmosphere becomes long, the number of the N atoms with respect to the O atoms is increased.

More specifically, as the time of exposing the Cu wiring electrode 17 under the $NH_3$ atmosphere becomes longer, $Cu_2O$, CuO, etc., which are the oxide film formed on the surface of the Cu wiring electrode 17, are successively reduced; therefore, O atoms are discharged from the surface of the Cu wiring electrode 17, and N atoms are attached to the surface of the Cu wiring electrode 17. It is conceivable that, when the time of exposing the Cu wiring electrode 17 under the $NH_3$ atmosphere is extended to successively reduce $Cu_2O$, CuO, etc., which are the oxide film formed on the surface of the Cu wiring electrode 17, reduction of the amounts of the gases containing the O atoms, etc. in the Cu wiring electrode 17 can be facilitated in the heating process of step S9 of the first embodiment of the present invention. Therefore, it is conceivable that, when the time of exposing the Cu wiring electrode 17 in the $NH_3$ atmosphere is extended, the adhesive force of the diffusion prevention film 11 to the Cu wiring electrode 17 can be improved.

However, as shown in FIG. 14 and FIG. 15, when the time of exposing the Cu wiring electrode 17 under the $NH_3$ atmosphere is 15 seconds, in other words, when the numbers of the O atoms and N atoms are approximately equal at the interface between the Cu wiring electrode 17 and the diffusion prevention film 11, the adhesive force of the diffusion prevention film 11 to the Cu wiring electrode 17 becomes the highest. It can be understood that, when the time of exposing the Cu wiring electrode 17 under the $NH_3$ atmosphere is extended thereafter, in other words, when the number of the N atoms with respect to the O atoms is further increased, the adhesive force of the diffusion prevention film 11 to the Cu wiring electrode 17 is lowered.

The following things are conceivable as the reasons why the adhesive force of the diffusion prevention film 11 to the Cu wiring electrode 17 is lowered when the time of exposing the Cu wiring electrode 17 under the $NH_3$ atmosphere becomes long and the number of the N atoms with respect to the O atoms is increased at the interface between the Cu wiring electrode 17 and the diffusion prevention film 11.

As the first one, it is conceivable that, when the time of exposing the Cu wiring electrode 17 under the $NH_3$ atmosphere becomes long, a film of the compounds of the N atoms and Cu atoms attached to the surface of the Cu wiring electrode 17 is formed on the surface of the Cu wiring electrode 17. Herein, the adhesive force between the film of the compounds of the N atoms and Cu atoms and the diffusion prevention film 11 is conceivably lower than the adhesive force between the surface of the Cu wiring electrode 17 on which the film is not formed by the compounds and the diffusion prevention film 11. Therefore, when the film of the compounds of the N atoms and Cu atoms is increased on the surface of the Cu wiring electrode 17, the adhesive force of the diffusion prevention film 11 to the Cu wiring electrode 17 may be lowered.

As the second one, it is conceivable that, when the time of exposing the Cu wiring electrode 17 under the $NH_3$ atmosphere becomes long, a film of compounds of impurities such as metal other than Cu and the Cu atoms contained in the Cu wiring electrode 17 is formed on the surface of the Cu wiring electrode 17. Herein, the adhesive force between the film of the compounds of the impurities and the Cu atoms contained in the Cu wiring electrode 17 and the diffusion prevention film 11 is conceivably lower than the adhesive force between the surface of the Cu wiring electrode 17 on which the film is not formed by the compounds and the diffusion prevention film 11. Therefore, if the film of the compounds of the impurities and Cu atoms contained in the Cu wiring electrode 17 is increased at the surface of the Cu wiring electrode 17, the adhesive force of the diffusion prevention film 11 to the Cu wiring electrode 17 may be reduced.

As the third one, a conceivable reason is that the film of the compounds of the N atoms and Cu atoms formed on the surface of the Cu wiring electrode 17 and the film of the compounds of the impurities and Cu atoms contained in the Cu wiring electrode 17 in the reducing process of the Cu wiring electrode 17 disturb desorption of the gases containing O atoms, etc. from the inside of the Cu wiring electrode 17 in the heating process of step S9 of the first embodiment of the present invention.

Also, when heating is carried out for the Cu wiring electrode 17 in step S9, the Cu wiring electrode 17 desorbs the gases of O atoms, H atoms, $H_2O$, and $CO_2$ contained in the Cu wiring electrode 17. Therefore, the Cu wiring electrode 17 after step S9 is carried out has the O atoms having a surface density of $1 \times 10^{14}$ cm$^{-2}$ or less, which is lower than the surface density of the O atoms contained in the Cu wiring electrode before step S9 is carried out. Moreover, the Cu wiring electrode 17 after step S9 is carried out has H atoms (hydrogen atoms) having a surface density of $1 \times 10^{15}$ cm$^{-2}$ or less, which is lower than the surface density of the H atoms contained in the Cu wiring electrode 17 before step S9 is carried out.

Note that, in the first embodiment of the present invention, the semiconductor element 18 is an n-type silicon-carbide Schottky barrier diode, but it goes without saying that the semiconductor element 18 may be a p-type. Also, in the first embodiment of the present invention, SiC is used as the base material of the semiconductor element 18, but another wide bandgap semiconductor may be used.

A semiconductor element using a wide bandgap semiconductor such as SiC as a base material draws attention as a device material capable of withstanding high voltages and is required to operate under high voltages. If an oxide film is formed between the Cu wiring electrode 17 and the diffusion prevention film 11, the withstand voltage of the semiconductor device is lowered or become unstable. Then, this easily leads to destruction or unstable operation of the semiconductor device. The semiconductor device of the first embodiment of the present invention is important also for realizing stable high-withstand-voltage operation by using the wide bandgap semiconductor.

Note that, in the first embodiment of the present invention, the Schottky barrier diode is used as the semiconductor element 18, but it goes without saying that another device such as JBS (Junction Barrier Schottky), MOSFET (Metal Oxide Field Effect Transistor), JFET (Junction Field Effect Transistor), IGBT (Insulated Gate Bipolar Transistor), or a PN diode may be used.

Second Embodiment

In a second embodiment of the present invention, the part different from the first embodiment of the present invention will be described, and the description about the same or corresponding part will be omitted. A method for manufacturing a semiconductor device according to the second embodiment of the present invention replaces step S9 of the method for manufacturing the semiconductor device according to the first embodiment of the present invention with step S19. In step S9 of the first embodiment of the present invention, the reducing process and the heating process are carried out at the same time for the Cu wiring electrode; however, in step S19 of the second embodiment of the present invention, a reducing process and a heating process are separately carried out.

Figure 16:
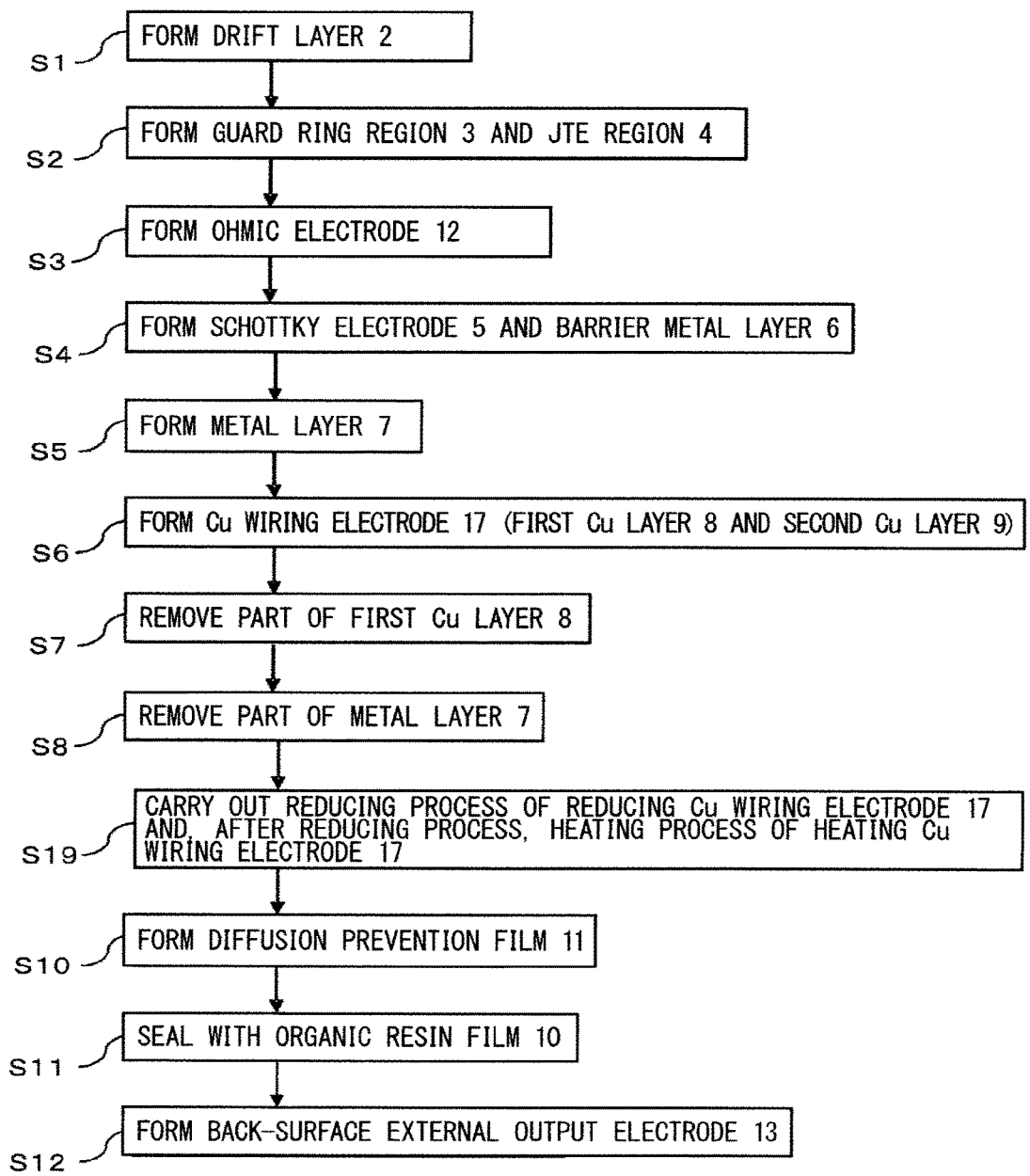
FIG. 16 is a process flow diagram showing a method for manufacturing a semiconductor device according to a second embodiment of the present invention.

FIG. 16 is a process flow diagram showing the method for manufacturing the semiconductor device according to the second embodiment of the present invention. Since only the points different from the first embodiment of the present invention will be described, only step S19 of FIG. 16 which replaces step S9 of the first embodiment of the present invention will be described. Steps shown in FIG. 16 are similar to those of FIG. 2 except for step S19. Even when the method for manufacturing the semiconductor device according to the second embodiment of the present invention is used, the same semiconductor device as the semiconductor device manufactured by the method for manufacturing the semiconductor device according to the first embodiment of the present invention will be manufactured.

In step S19 of FIG. 16, the reducing process of reducing the Cu wiring electrode 17 under a $NH_3$ atmosphere and, after the reducing process, the heating process of heating the Cu wiring electrode 17 under a vacuum atmosphere are carried out. First, the reducing process of reducing the Cu wiring electrode 17 under the $NH_3$ atmosphere is carried out. The first chip is placed in, for example, a chamber of a CVD apparatus, and $NH_3$ is poured into the chamber. Then, at the same time as pouring of $NH_3$ thereinto, the gas in the chamber is also discharged. The temperature in the chamber at this point s not particularly limited in the second embodiment of the present invention. The time of exposing the Cu wiring electrode 17 under the $NH_3$ atmosphere, in other words, the time of exposing the first chip under the $NH_3$ atmosphere is preferred to be the time which is longer than 0 second and 120 seconds or less as well as the first embodiment of the present invention. It is further preferred that the time be longer than 0 second and 45 seconds or less.

Then, in step S19, after the reducing process, the heating process of heating the Cu wiring electrode 17 under the vacuum atmosphere is carried out. Pouring of $NH_3$ into the chamber is stopped, only discharge of the gas in the chamber is carried out, and the first chip is heated to a predetermined temperature. It is preferred to increase the temperature of the first chip until the temperature of the Cu wiring electrode 17 becomes 150° C. or more as well as the first embodiment of the present invention. It is further preferred that the temperature of the Cu wiring electrode 17 be increased to 300° C. or more.

The reducing process of step S19 of the second embodiment of the present invention is carried out for the same purpose as the reducing process of step S9 of the first embodiment of the present invention, the phenomenon caused at the surface of the Cu wiring electrode 17 by the reducing process of step S19 of the second embodiment of the present invention is also the same as the phenomenon caused at the surface of the Cu wiring electrode 17 by the reducing process of step S9 of the first embodiment of the present invention, and the oxide film is reduced. Also, the heating process of step S19 of the second embodiment of the present invention is carried out for the same purpose as the heating process of step S9 of the first embodiment of the present invention, the phenomenon caused at the surface of the Cu wiring electrode 17 by the heating process of step S19 of the second embodiment of the present invention is also the same as the phenomenon caused at the surface of the Cu wiring electrode 17 by the heating process of step S9 of the first embodiment of the present invention, and the gases in the Cu wiring electrode 17 are desorbed.

As well as step S9 of the first embodiment of the present invention, also in step S19 of the second embodiment of the present invention, both of the reducing process of reducing the Cu wiring electrode 17 and the heating process of heating the Cu wiring electrode 17 have to be carried out.

Moreover, in the second embodiment of the present invention, in step S19, the reducing process under the $NH_3$ atmosphere has to be carried out first, and the heating process under the vacuum atmosphere has to be carried out after the reducing process. This is for a reason that, if the heating process under the vacuum atmosphere is carried out first to carry out the reducing process under the $NH_3$ atmosphere after the heating process, the heating process is carried out before the oxide film on the surface of the Cu wiring electrode 17 is removed, the oxide film on the surface of the Cu wiring electrode 17 disturbs desorption of the gases from the inside of the Cu wiring electrode 17 in the heating process, and the gases cannot be desorbed from the inside of the Cu wiring electrode 17.

Even when the method for manufacturing the semiconductor device according to the second embodiment of the present invention is used, the same semiconductor device as the semiconductor device manufactured by the method for manufacturing the semiconductor device according to the first embodiment of the present invention is manufactured; therefore, the second embodiment of the present invention also have similar effects as the first embodiment of the present invention.

Third Embodiment

In a third embodiment of the present invention, the part different from the first embodiment or the second embodiment of the present invention will be described, and the description of the same or corresponding part will be omitted. A method for manufacturing a semiconductor device according to the third embodiment of the present invention eliminates step S5 from the method for manufacturing the semiconductor device according to the first embodiment of the present invention (or the second embodiment of the present invention). Along with that, step S8 is also eliminated. The semiconductor device manufactured by the method for manufacturing the semiconductor device according to the third embodiment of the present invention has a configuration eliminating the metal layer 7 from the semiconductor device manufactured by the method for manufacturing the semiconductor device according to the first embodiment of the present invention (or the second embodiment of the present invention).

Figure 17:
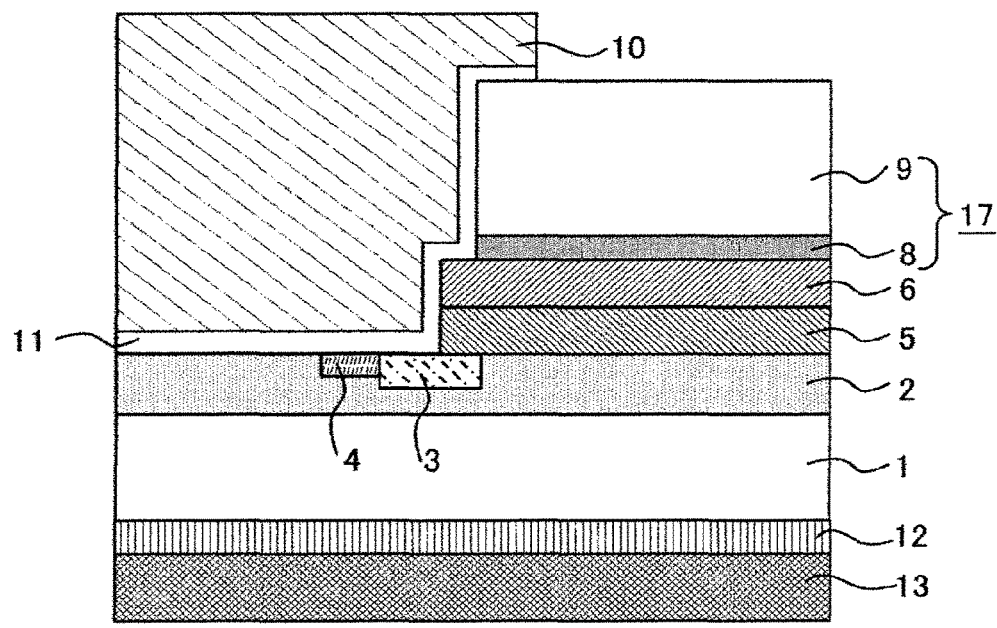
FIG. 17 is part of a cross-sectional view showing a configuration of a semiconductor device manufactured by a method for manufacturing the semiconductor device according to a third embodiment.

FIG. 17 shows the semiconductor device manufactured by the method for manufacturing the semiconductor device according to the third embodiment of the present invention. The semiconductor device shown in FIG. 17 has the configuration in which the metal layer 7 is eliminated from the semiconductor device of FIG. 1, and the other configuration is similar to the semiconductor device of FIG. 1.

In the semiconductor device of the first embodiment of the present invention, the metal layer 7 is provided in order to improve the adhesive force of the Cu wiring electrode 17 to the Schottky electrode 5 and to prevent Cu of the first Cu layer 8 from diffusing to the drift layer 2. However depending on the material used in the barrier metal layer 6, the adhesive force of the Cu wiring electrode 17 to the Schottky electrode 5 can be sufficiently ensured in some cases without the metal layer 7. For example, it is a case in which a material such as W, Ta, Ti, or Mo is used in the barrier metal layer 6.

Also, for example, if a method of forming the first Cu film 8 only on the upper surface of the barrier metal layer 6 by using a lift-off method is employed in the method of forming the Cu wiring electrode 17 in step S6, the problem of diffusion of Cu of the first Cu layer 8 to the drift layer 2 can be solved.

Therefore, depending on the material used in the barrier metal layer 6 and the method of forming the Cu wiring electrode 17, the metal layer 7 is not required to be provided. By virtue of this, in the method for manufacturing the semiconductor device according to the third embodiment of the present invention, manufacturing processes can be reduced.

Even when the method for manufacturing the semiconductor device according to the third embodiment of the present invention is used, the point that step S9 of the method for manufacturing the semiconductor device of the first embodiment of the present invention (or step S19 of the method for manufacturing the semiconductor device of the second embodiment of the present invention) is provided is not changed; therefore, the third embodiment of the present invention also has similar same effects as the first embodiment of the present invention.

Fourth Embodiment

In a fourth embodiment of the present invention, the part different from the first embodiment or the second embodiment of the present invention will be described, and the description about the same or corresponding part will be omitted. A method for manufacturing a semiconductor device according to the fourth embodiment of the present invention is characterized in that, when the metal layer 7 is formed in step S5 and when the first Cu layer 8 is formed in step S6 in the method for manufacturing the semiconductor device of the first embodiment of the present invention (or the second embodiment of the present invention) the shapes of the metal layer 7 and the first Cu layer 8 are configured to be the same as the shapes of the Schottky electrode 5 and the barrier metal layer 6 when viewed from the upper side.

Figure 18:
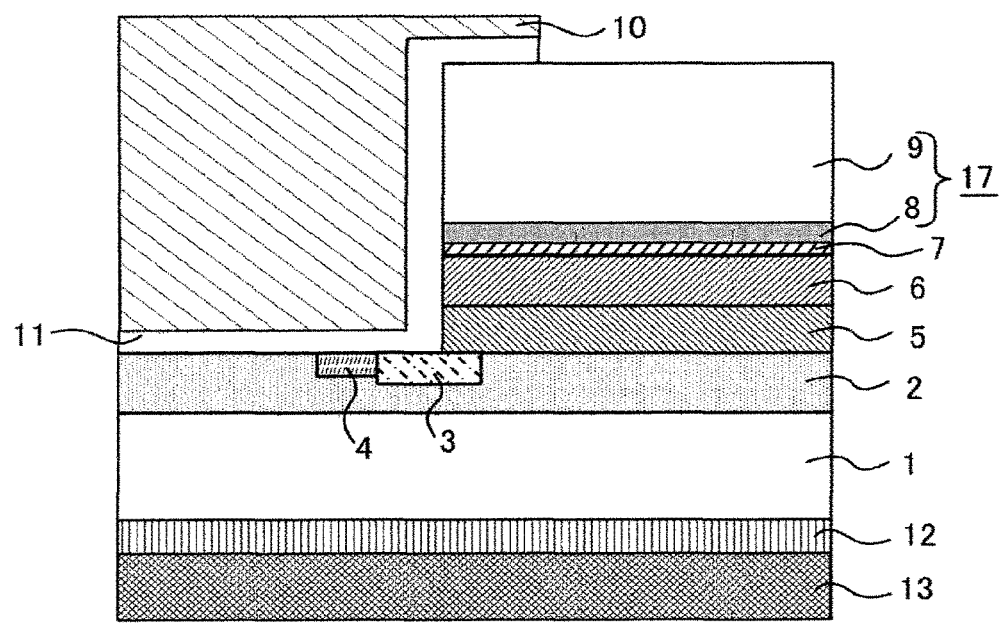
FIG. 18 is part of a cross-sectional view showing a configuration of a semiconductor device manufactured by a method for manufacturing the semiconductor device according to a fourth embodiment.

FIG. 18 shows a semiconductor device manufactured by the method for manufacturing the semiconductor device according to the fourth embodiment of the present invention. The semiconductor device of FIG. 18 is only configured so that the shape of the Cu wiring electrode 17 including the metal layer 7 and the first Cu layer 8 is the same as the shapes of the Schottky electrode 5 and the barrier metal layer 6 when viewed from the upper side, and the constituent elements thereof are similar to the semiconductor device of FIG. 1.

In the first embodiment of the present invention, the Schottky electrode 5 and the barrier metal layer 6 are formed first, and the metal layer 7 and the first Cu layer 8 are formed thereafter. Therefore, in order to prevent shape abnormalities of the metal layer 7 and the first Cu layer 8 due to the positional misalignment of the resist mask 16 in pattern formation of the metal layer 7 and the first Cu layer 8, the shapes of the metal layer 7 and the first Cu layer 8 formed thereafter are formed to be smaller than the Schottky electrode 5 and the barrier metal layer 6.

In the fourth embodiment of the present invention, the Schottky electrode 5, the barrier metal layer 6, the metal layer 7, and the first Cu layer 8 are configured to have the same shape when viewed from the upper side; therefore, a lithography process in pattern processing is required only once. Therefore, in the method for manufacturing the semiconductor device according to the fourth embodiment of the present invention, manufacturing time can be reduced. Furthermore, since the Schottky electrode 5, the barrier metal layer 6, the metal layer 7, and the first Cu layer 8 are configured to have the same shape when viewed from the upper side, the skirt part can be reduced; therefore, improvement of the coverage property of the diffusion prevention film 11 can be also realized. As a result of these, in the fourth embodiment of the present invention, the yield of the semiconductor device can be improved, and manufacturing cost of the semiconductor device can be reduced.

Even when the method for manufacturing the semiconductor device according to the fourth embodiment of the present invention is used, the point that step S9 of the method for manufacturing the semiconductor device of the first embodiment of the present invention (or step S19 of the method for manufacturing the semiconductor device of the second embodiment of the present invention) is provided is not changed; therefore, the fourth embodiment of the present invention also has similar effects as the first embodiment of the present invention.

Fifth Embodiment

In a fifth embodiment of the present invention, the part different from the first embodiment to the fourth embodiment of the present invention will be described, and the description of the same or corresponding part will be omitted. The method for manufacturing the semiconductor device according to the fifth embodiment of the present invention is further provided with four processes after step S12 of the method for manufacturing the semiconductor device of the first embodiment to the fourth embodiment of the present invention.

In the first embodiment of the present invention, the semiconductor device is a so-called semiconductor chip using the semiconductor element 18, the Cu wiring electrode 17, the diffusion prevention film 11, and the organic resin film 10 as shown in FIG. 1. However, the semiconductor devices in the present description mean not only the semiconductor chip as shown in FIG. 1, but also include a power module equipped with an insulating substrate, leads, etc. in addition to the semiconductor chip. Hereinafter, in the fifth embodiment of the present invention, the semiconductor device will be described as a so-called power module. Note that, in the second to fourth embodiments of the present invention, the semiconductor devices have been described as so-called semiconductor chips.

FIG. 19 shows a semiconductor device manufactured by the method for manufacturing the semiconductor device according to the fifth embodiment of the present invention. The semiconductor device of FIG. 19 is provided with a semiconductor chip 22, an insulating substrate 31 joined with the semiconductor chip 22 via a joining material 30, a cooler 27 joined with the insulating substrate 31 via a joining material 26, a lead 21 joined on the semiconductor chip 22 via a joining material 29, and a sealing resin 28 sealing the semiconductor chip 22, the insulating substrate 31, and the lead 21. The insulating substrate 31 has a first conductor 23 on a first-side surface of the insulating ceramics 24 and has a second conductor 25 on a second-side surface thereof. The semiconductor chip 22 of FIG. 19 will be hereinafter described by taking the semiconductor chip manufactured in the first embodiment of the present invention as an example.

The method for manufacturing the semiconductor device according to the fifth embodiment of the present invention is the manufacturing method of the first embodiment of the present invention further provided with the processes of step S21 to step S24 described below. Step S21 is a process of joining the insulating substrate 31 on the first-side surface of the semiconductor chip 22 via the joining material 30. "On the first-side surface of the semiconductor chip" is on the surface in the opposite side of the surface on which the Cu wiring electrode 17 of the semiconductor element 18 of the first embodiment of the present invention is formed. In the present description, the side in which the drift layer 2 of the substrate 1 of the semiconductor element 18 is formed is described as the upper side; therefore, in other words, the insulating substrate 31 is joined below the semiconductor element 18. Since the insulating substrate 31 is only required to be joined below the semiconductor element 18, the back-surface external output electrode 13, the joining material 30, etc. may be interposed between the insulating substrate 31 and the semiconductor element 18.

Step S22 is a process of joining the cooler 27 via the joining material 26 on the surface of the insulating substrate 31 which is in the opposite side of the surface on which the semiconductor chip 22 is joined. "On the surface of the insulating substrate 31 which is in the opposite side of the surface on which the semiconductor chip 22 is joined" is below the insulating substrate 31. Since the cooler 27 is only required to be joined below the insulating substrate 31, the joining material 26, another material, etc. may be interposed between the cooler 27 and the insulating substrate 31.

Step S23 is a process of joining the lead 21 on the second-side surface of the semiconductor chip 22 via the joining material 29. "On the second-side surface of the semiconductor chip 22" is on the partially exposed surface of the Cu wiring electrode 17 of the first embodiment of the present invention. In other words, the lead 21 is joined above the Cu wiring electrode 17. The lead 21 is only required to be joined above the Cu wiring electrode 17, the joining material 29, another member, etc. may be interposed between the lead 21 and the Cu wiring electrode 17.

Step S24 is a process of sealing the semiconductor chip 22, the insulating substrate 31, and the lead 21 with the sealing resin 28.

In the fifth embodiment of the present invention, the cooler 27 is installed in the side of the back-surface external output electrode 13 of the semiconductor chip 22 (below the semiconductor chip 22), but may be installed in the side of the Cu wiring electrode 17 of the semiconductor chip 22 (above the semiconductor chip 22). As a matter of course, coolers may be installed both above and below the semiconductor chip 22.

The semiconductor device manufactured by the method for manufacturing the semiconductor device according to the fifth embodiment of the present invention can be operated at the temperatures exceeding 200° C. Moreover, by using the structure in which the heat resistance between the semiconductor chip 22 and the cooler 27 is suppressed, downsizing of the semiconductor device can be realized, and versatility is expanded. By virtue of this, downsizing of an inverter can be also realized.

Even when the method for manufacturing the semiconductor device according to the fifth embodiment of the present invention is used, the point that step S9 of the method for manufacturing the semiconductor device of the first embodiment of the present invention (or step S19 of the method for manufacturing the semiconductor device of the second embodiment of the present invention) is provided is not changed; therefore, the fifth embodiment of the present invention also has similar effects as the first embodiment of the present invention.

Sixth Embodiment

In a sixth embodiment of the present invention, the part different from the first embodiment of the present invention to the fifth embodiment of the present invention will be described, and the description about the same or corresponding part will be omitted. A method for manufacturing a semiconductor device according to the sixth embodiment of the present invention only changes the gas, which is used in the reducing process of step S9 or step S19 of the methods for manufacturing the semiconductor devices according to the first embodiment of the present invention to the fifth embodiment of the present invention, from $NH_3$ to $H_2$.

The method for manufacturing the semiconductor device according to the sixth embodiment of the present invention is approximately the same as the method for manufacturing the semiconductor device according to the first embodiment of the present invention to the method for manufacturing the semiconductor device according to the fifth embodiment of the present invention. For example, if the method for manufacturing the semiconductor device according to the sixth embodiment of the present invention is approximately the same as the method for manufacturing the semiconductor device according to the first embodiment of the present invention, all steps shown in FIG. 2 are included. If the method for manufacturing the semiconductor device according to the sixth embodiment of the present invention is approximately the same as the method for manufacturing the semiconductor device according to the second embodiment of the present invention, all steps shown in FIG. 16 are included.

The only point the method for manufacturing the semiconductor device according to the sixth embodiment of the present invention is different from the first embodiment of the present invention to the fifth embodiment of the present invention is the type of the gas poured into the chamber in the reducing process of step S9 of FIG. 2 or step 19 of FIG. 16. While the gas is $NH_3$ in the first embodiment of the present invention to the fifth embodiment of the present invention, $H_2$ (hydrogen) is used instead of $NH_3$ in the sixth embodiment of the present invention.

Figure 20:
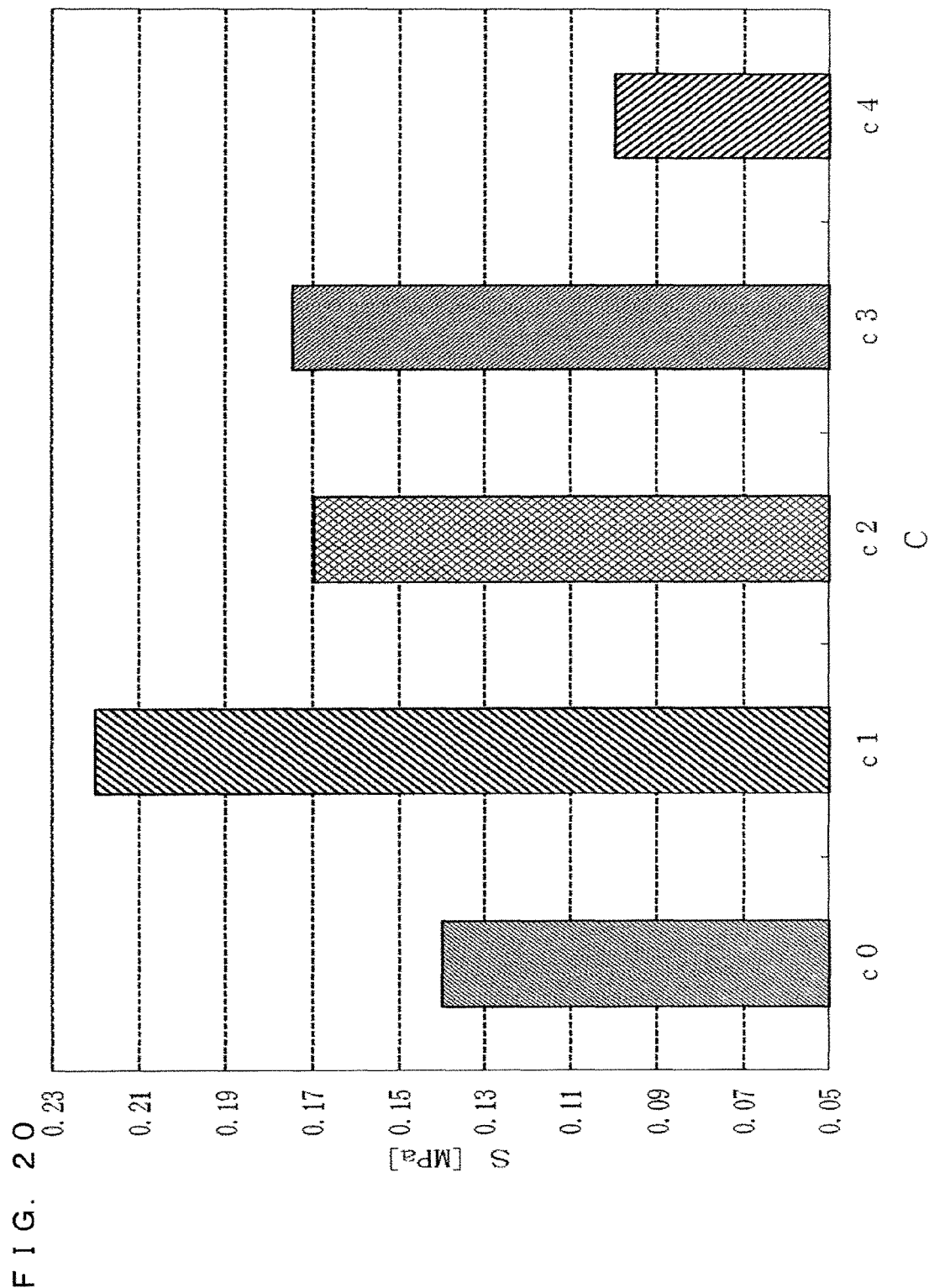
FIG. 20 is a graph showing the relation between the conditions of the reducing process of step S9 or step S19 and the adhesive force of the diffusion prevention film to the Cu wiring electrode.

FIG. 20 is a graph showing the relation between conditions C of the reducing process of step 9 or step 19 and the adhesive force S [MPa] of the diffusion prevention film 11 to the Cu wiring electrode 17. The condition C of the reducing process of step 9 or step 19 is any of c0 to c4 as shown in FIG. 20. "c0" is a case in which step S9 or step S19 is not carried out, "c1" is a case in which the Cu wiring electrode 17 is exposed under a $NH_3$ atmosphere for 15 seconds, "c2" is a case in which the Cu wiring electrode 17 is exposed under a $H_2$ atmosphere for 15 seconds, "c3" is a case in which the Cu wiring electrode 17 is exposed under a $H_2$ atmosphere for 30 seconds, and "c4" is a case in which the Cu wiring electrode 17 is exposed under a $SiH_4$ (silane) atmosphere for 15 seconds. According to FIG. 20, it can be understood that, in c2 and c3 in which the Cu wiring electrode 17 is exposed under the $H_2$ atmosphere in the reducing process of step 9 or step S19, the adhesive force of the diffusion prevention film 11 to the Cu wiring electrode 17 is improved compared with c0 which is the case in which step S9 or step S19 is not carried out.

Even when $H_2$ is used instead of $NH_3$, the reducing process of step S9 or step S19 of the method for manufacturing the semiconductor device according to the sixth embodiment of the present invention is also used for the same purpose as the reducing process of step S9 of the first embodiment of the present invention and step 19 of the second embodiment of the present invention. The phenomenon caused at the surface of the Cu wiring electrode 17 by the reducing process of step S9 or step S19 of the sixth embodiment of the present invention is also approximately the same as the phenomenon caused at the surface of the Cu wiring electrode 17 by the reducing process of step S9 of the first embodiment of the present invention and step 19 of the second embodiment of the present invention, and the oxide film formed on the surface of the Cu wiring electrode 17 is reduced.

When $H_2$ is used instead of $NH_3$, the H atoms of $H_2$ only react with the O atoms of the oxide film on the surface of the Cu wiring electrode 17, become $H_2O$, and are discharged from the surface of the Cu wiring electrode 17. Therefore, N atoms do not attach to the surface of the Cu wiring electrode 17 like the reducing processes of step S9 of the first embodiment of the present invention and step 19 of the second embodiment of the present invention.

The heating process of step S9 of the method for manufacturing the semiconductor device according to the sixth embodiment of the present invention is the same as the heating process of step 9 of the method for manufacturing the semiconductor device according to the first embodiment of the present invention. Similarly, the heating process of step S19 of the method for manufacturing the semiconductor device according to the sixth embodiment of the present invention is the same as the heating process of step 19 of the method for manufacturing the semiconductor device according to the second embodiment of the present invention.

Even when the method for manufacturing the semiconductor device according to the sixth embodiment of the present invention is used, the same semiconductor device as the semiconductor device manufactured by the method for manufacturing the semiconductor device according to the first embodiment of the present invention or the second embodiment of the present invention is manufactured; therefore, it goes without saying that the sixth embodiment of the present invention also has similar effects as the first embodiment of the present invention to the fifth embodiment of the present invention.

Note that the present invention can freely combine the embodiments and arbitrarily modify and omit the embodiments within the scope of the invention. The dimensions, materials, and shapes of the constituent elements shown as examples in the embodiments, the relative dispositions thereof, etc. are arbitrarily changed depending on the configuration of an apparatus or various conditions to which the present invention is applied, and the present invention is not limited to these shown examples. Moreover, the dimensions of the constituent elements in the drawings may be different from actual dimensions.

REFERENCE SIGNS LIST

1: substrate
2: drift layer
3: guard ring region
4: JTE region
5: Schottky electrode
6: drift layer
7: metal layer
8: first Cu layer
9: second Cu layer
10: organic resin film
11: diffusion prevention film
12: ohmic electrode
13: back-surface external output electrode
15: etching mask
16: resist mask
17: Cu wiring electrode
18: semiconductor element
21: lead
22: semiconductor chip
23: first conductor
24: insulating ceramics
25: second conductor
26, 29, 30: joining material
27: cooler
28: sealing resin
31: insulating substrate

The invention claimed is:

1. A method for manufacturing a semiconductor device comprising:
a process of forming a Cu wiring electrode having a thickness of 6 μm or more and 100 μm or less by a plating method above a semiconductor element using a wide bandgap semiconductor as a base material, said semiconductor element being operated at a temperature exceeding 200° C.;
a reducing process of reducing said Cu wiring electrode under a $NH_3$ atmosphere not containing oxygen;
a heating process of heating said Cu wiring electrode at the same time as said reducing process;
a process of forming a diffusion prevention film covering said Cu wiring electrode continuously after said heating process; and
a sealing process of covering said diffusion prevention film with an organic resin film.

2. A method for manufacturing a semiconductor device comprising:
a process of forming a Cu wiring electrode having a thickness of 6 μm or more and 100 μm or less by a plating method above a semiconductor element using a wide bandgap semiconductor as a base material, said semiconductor element being operated at a temperature exceeding 200° C.;
a reducing process of reducing said Cu wiring electrode under a $NH_3$ atmosphere not containing oxygen;
a heating process of heating said Cu wiring electrode under a vacuum atmosphere after said reducing process;
a process of forming a diffusion prevention film covering said Cu wiring electrode continuously after said heating process; and
a sealing process of covering said diffusion prevention film with an organic resin film.

3. A method for manufacturing a semiconductor device comprising:
a process of forming a Cu wiring electrode having a thickness of 6 μm or more and 100 μm or less by a plating method above a semiconductor element using a wide bandgap semiconductor as a base material, said semiconductor element being operated at a temperature exceeding 200° C.;

a reducing process of reducing said Cu wiring electrode under a $H_2$ atmosphere not containing oxygen;

a heating process of heating said Cu wiring electrode under a vacuum atmosphere after said reducing process;

a process of forming a diffusion prevention film covering said Cu wiring electrode continuously after said heating process; and a sealing process of covering said diffusion prevention film with an organic resin film.

4. The method for manufacturing the semiconductor device according to claim 3, wherein said Cu wiring electrode is heated to a temperature of 150° C. or more in said heating process.

5. The method for manufacturing the semiconductor device according to claim 3, wherein said Cu wiring electrode is heated to a temperature of 300° C. or more in said heating process.

6. The method for manufacturing the semiconductor device according to claim 3, wherein said Cu wiring electrode is exposed under said $H_2$ atmosphere for time of 15 seconds or more and 120 seconds or less in said reducing process.

7. The method for manufacturing the semiconductor device according to claim 3, wherein said Cu wiring electrode is exposed under said $H_2$ atmosphere for time of 15 seconds or more and 45 seconds or less in said reducing process.

8. The method for manufacturing the semiconductor device according to claim 3, further comprising:

a process of joining an insulating substrate below said semiconductor element;

a process of joining a cooler below said insulating substrate;

a process of joining a lead above said Cu wiring electrode; and a process of sealing said semiconductor element, said Cu wiring electrode, said insulating substrate, and said lead with a sealing resin.

9. A semiconductor device comprising:

a Cu wiring electrode electrically connected to a semiconductor element using a wide bandgap semiconductor as a base material, said Cu wiring electrode formed above said semiconductor element and having a thickness of 6 µm or more and 100 µm or less, said semiconductor element being operated at a temperature exceeding 200° C.;

a diffusion prevention film covering said Cu wiring electrode; and an organic resin film covering said diffusion prevention film; wherein said Cu wiring electrode has more nitrogen atoms than oxygen atoms at an interface with said diffusion prevention film.

10. The semiconductor device according to claim 9, wherein said diffusion prevention film is a nitride.

11. The semiconductor device according to claim 9, wherein said diffusion prevention film is a silicon nitride.

12. The semiconductor device according to claim 9, wherein said Cu wiring electrode has oxygen atoms having a surface density of $1 \times 10^{14}$ cm$^{-2}$ or less.

13. The semiconductor device according to claim 9, wherein said Cu wiring electrode has hydrogen atoms having a surface density of $1 \times 10^{15}$ cm$^{-2}$ or less.

14. The method for manufacturing the semiconductor device according to claim 1, wherein said Cu wiring electrode is heated to a temperature of 150° C. or more in said heating process.

15. The method for manufacturing the semiconductor device according to claim 1, wherein said Cu wiring electrode is heated to a temperature of 300° C. or more in said heating process.

16. The method for manufacturing the semiconductor device according to claim 1, wherein said Cu wiring electrode is exposed under said $NH_3$ atmosphere for time of 15 seconds or more and 120 seconds or less in said reducing process.

17. The method of manufacturing the semiconductor device according to claim 1, wherein said Cu wiring electrode is exposed under said $NH_3$ atmosphere for time of 15 seconds or more and 45 seconds or less in said reducing process.

18. The method for manufacturing the semiconductor device according to claim 1, further comprising:

a process of joining an insulating substrate below said semiconductor element;

a process of joining a cooler below said insulating substrate;

a process of joining a lead above said Cu wiring electrode; and a process of sealing said semiconductor element, said Cu wiring electrode, said insulating substrate, and said lead with a sealing resin.

19. The method for manufacturing the semiconductor device according to claim 2, wherein said Cu wiring electrode is heated to a temperature of 150° C. or more in said heating process.

20. The method for manufacturing the semiconductor device according to claim 2, wherein said Cu wiring electrode is heated to a temperature of 300° C. or more in said heating process.

21. The method for manufacturing the semiconductor device according to claim 2, wherein said Cu wiring electrode is exposed under said $NH_3$ atmosphere for time of 15 seconds or more and 120 second or less in said reducing process.

22. The method for manufacturing the semiconductor device according to claim 2, wherein said Cu wiring electrode is exposed under said $NH_3$ atmosphere for time of 15 seconds or more and 45 seconds or less in said reducing process.

23. The method for manufacturing the semiconductor device according to claim 2, further comprising:

a process of joining an insulating substrate below said semiconductor element;

a process of joining a cooler below said insulating substrate;

a process of joining a lead above said Cu wiring electrode; and a process of sealing said semiconductor element, said Cu wiring electrode, said insulating substrate, and said lead with a sealing resin.

* * * * *